United States Patent
Hegde

(10) Patent No.: US 7,028,757 B1
(45) Date of Patent: Apr. 18, 2006

(54) TWIN FIN ARRAYED COOLING DEVICE WITH LIQUID CHAMBER

(75) Inventor: Shankar Hegde, Bangalore (IN)

(73) Assignee: Hewlett-Packard Development Company, L.P., Houston, TX (US)

( * ) Notice: Subject to any disclaimer, the term of this patent is extended or adjusted under 35 U.S.C. 154(b) by 35 days.

(21) Appl. No.: 10/971,914

(22) Filed: Oct. 21, 2004

(51) Int. Cl.
*F28D 15/00* (2006.01)
*H05K 7/20* (2006.01)

(52) U.S. Cl. .............. 165/104.21; 165/80.3; 165/185; 165/104.33

(58) Field of Classification Search ........... 165/80.3, 165/80.4, 104.21, 104.33, 104.34; 361/699, 361/700, 704; 174/15.2; 257/714–715
See application file for complete search history.

(56) References Cited

U.S. PATENT DOCUMENTS

| | | | |
|---|---|---|---|
| 4,333,520 A * | 6/1982 | Yanadori et al. | 165/59 |
| 5,288,203 A | 2/1994 | Thomas | |
| 5,964,285 A * | 10/1999 | Huang | 165/185 |
| 6,109,340 A | 8/2000 | Nakase et al. | |
| 6,118,658 A | 9/2000 | Nakase | |
| 6,134,108 A | 10/2000 | Patel et al. | |
| 6,152,214 A | 11/2000 | Wagner | |
| 6,176,299 B1 | 1/2001 | Hanzlik et al. | |
| 6,206,087 B1 | 3/2001 | Nakase et al. | |
| 6,259,601 B1 | 7/2001 | Jaggers et al. | |
| 6,315,032 B1 * | 11/2001 | Lee et al. | 165/80.3 |
| D464,938 S | 10/2002 | Hegde | |
| 6,504,721 B1 * | 1/2003 | Watwe et al. | 361/700 |
| 6,505,680 B1 | 1/2003 | Hegde | |
| 6,508,300 B1 | 1/2003 | Hegde | |
| D471,523 S | 3/2003 | Hegde | |
| D471,881 S | 3/2003 | Hegde | |
| 6,543,522 B1 | 4/2003 | Hegde | |
| 6,631,756 B1 | 10/2003 | Hegde | |
| 6,705,795 B1 | 3/2004 | Hegde | |
| 6,779,593 B1 | 8/2004 | Hegde | |
| 6,789,610 B1 | 9/2004 | Hegde | |
| 2004/0163796 A1 * | 8/2004 | Wu et al. | 165/80.4 |
| 2004/0244948 A1 * | 12/2004 | Luo | 165/80.3 |
| 2005/0067143 A1 * | 3/2005 | Huang et al. | 165/80.3 |

FOREIGN PATENT DOCUMENTS

JP   04196154 A  * 7/1992

* cited by examiner

*Primary Examiner*—Tho Duong
(74) *Attorney, Agent, or Firm*—Richard P. Lange

(57) ABSTRACT

A cooling device for dissipating heat from a component is disclosed. The cooling device includes a core with a plurality of twin fins connected with the core and a liquid chamber in thermal communication with the component. The liquid chamber includes a reservoir with a liquid therein and the core includes a cavity with a liquid therein. A heat pipe is connected with the liquid chamber and with the core and the heat pipe is in contact with the liquid in the reservoir and the liquid in the cavity so that waste heat in the liquid chamber is thermally communicated to the core and is dissipated by an air flow over the twin fins and the core.

30 Claims, 23 Drawing Sheets

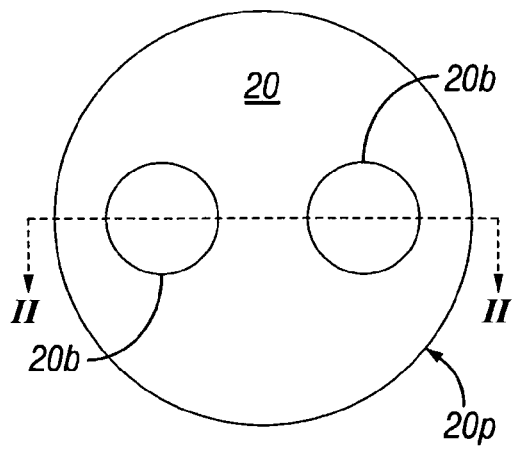
FIG. 5a
FIG. 5b
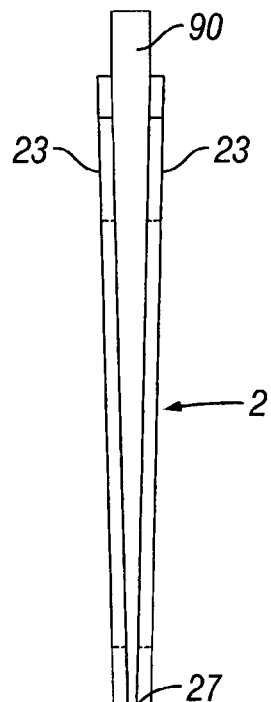
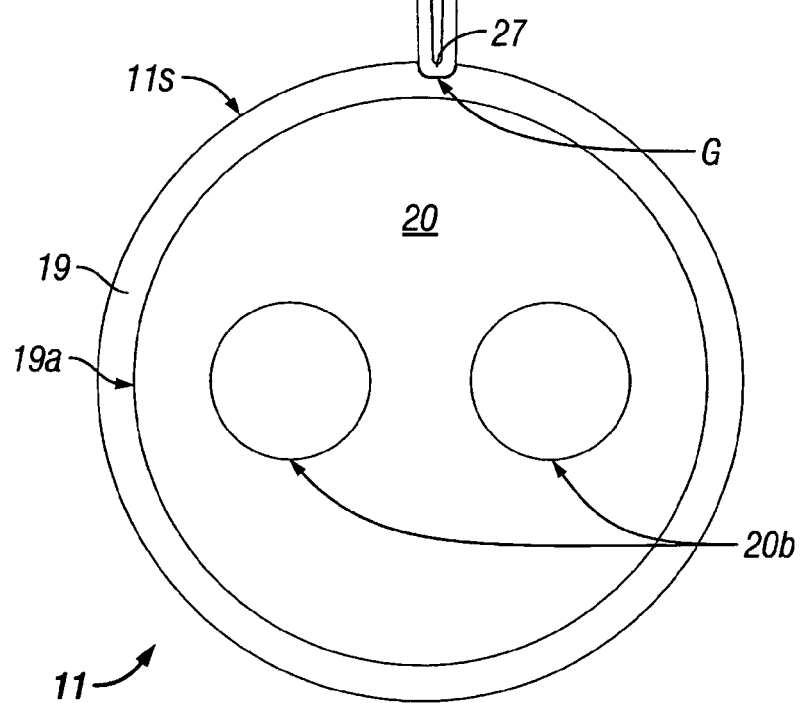
FIG. 5c

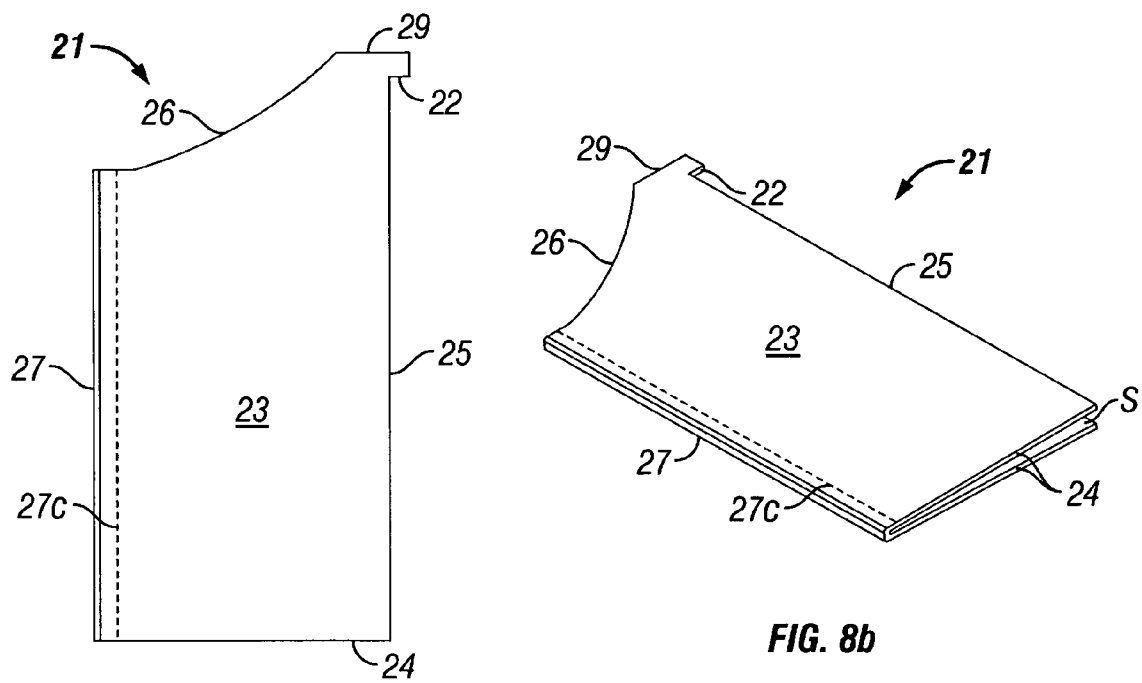
FIG. 8a
FIG. 8b
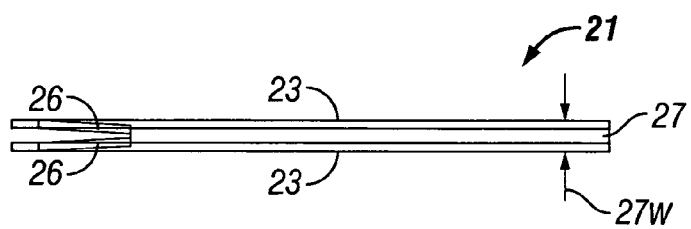
FIG. 8c
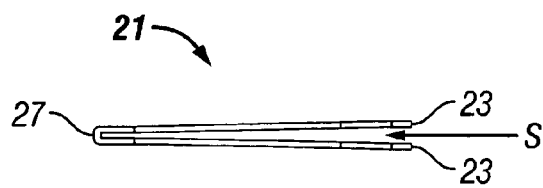
FIG. 8d
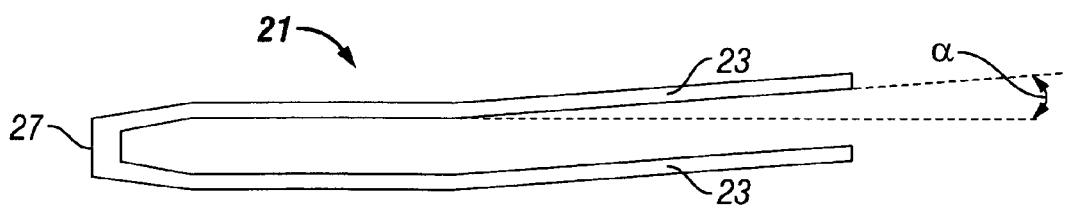
FIG. 8e

TWIN FIN ARRAYED COOLING DEVICE WITH LIQUID CHAMBER

FIELD OF THE INVENTION

The present invention relates generally to a cooling device for dissipating heat from a component in thermal communication with the cooling device. More specifically, the present invention relates to a cooling device including a core with a plurality of twin fins connected with the core and a liquid chamber in thermal communication with the component. Waste heat from the component is thermally communicated from the liquid chamber to the core by a heat pipe connected with the liquid chamber and the core. The heat pipe is in contact with a liquid in a reservoir of the liquid chamber and in contact with a liquid in a cavity in the core.

BACKGROUND OF THE INVENTION

It is well known in the electronics art to place a heat sink in contact with an electronic device so that waste heat generated by operation of the electronic device is thermally transferred to the heat sink to cool the electronic device. However, with continued increases in areal densities and system clock speeds in electronic devices such as microprocessors (CPU's), digital signal processors (DSP's), and application specific integrated circuits (ASIC), the amount of waste heat generated by those electronic devices and the operating temperature of those electronic devices are directly proportional to clock speed and device geometries. Efficient operation of a CPU as well as other high power dissipation electronic devices requires that waste heat be continuously and effectively removed.

However, as the aforementioned areal densities and system clock speeds of electronic devices continue to increase, a heat flux of the electronic devices also increases. Although air cooled heat sinks are commonly used to dissipate waste heat from the aforementioned electronic devices, the increased heat flux in high performance electronic devices is often concentrated in a small area, usually on a package surface that will be placed in thermal contact with the heat sink. The ability to effectively dissipate ever increasing levels of heat flux in high performance electronic devices has challenged current heat sink designs where the entire heat sink is fabricated using processes such as machining, forging, casting, and extrusion. Those processes make it difficult to increase the number of fins or an area of the fins in order to effectively dissipate heat flux concentration.

Typically, a heat mass includes a mounting surface that is in thermal communication with the electronic device and is operative to thermally conduct the waste heat away from the device and into the heat mass. As a result, the heat flux from the electronic device is concentrated in the area of the heat mass near the mounting surface. Ideally, it is desirable to spread the heat flux in the heat mass over as much of a volume of the heat mass as possible so that the heat is efficiently transferred to the fins and dissipated by the air flow over the fins.

Heat flux is a thermal output per unit of area (i.e. W/cm$^2$). For example, if a total thermal output is 100 Watts over a heat source having dimensions of 3.5 cm*3.5 cm, then the heat flux is 100 W÷(3.5 cm*3.5 cm)=8.163 W/cm$^2$. At present, based on area and cost constraints, electronic device package size remains the same or decreases while the areal densities and clock speeds continue to increase. Consequently, the problems associated with heat flux concentration continue to increase and those problems cannot be solved solely by increasing heat sink size, the number of fins, or fan capacity.

Heat flux concentration can be exacerbated by conditions that reduce an efficiency of heat transfer to/from the heat mass. In instances where a liquid is used to transfer waste heat to the heat mass, a tilting of the heat mass from an optimal position (e.g. a horizontal orientation) can result in the liquid being displaced with a resulting reduction in thermal transfer from the liquid to the heat mass. In some prior heat sink designs, a heat pipe in contact with the liquid is used to transfer the waste heat from the liquid to the heat mass. However, the displacement of the liquid caused by the titling can result in a reduced contact or no contact at all between the heat pipe and the liquid. Consequently, heat transfer to the heat mass is reduced when the heat sink has a non-optimal orientation.

Typically, waste heat from the heat mass is dissipated by an air flow through fins that are connected with the heat mass. However, in many prior heat sink designs, a bottom portion of the fins are placed in close proximity to a base plate that is used to mount the heat mass (e.g. mounting surface) in thermal communication with the electronic device to be cooled. The air flow passes through the fins and is obstructed by the base plate resulting in reduced air flow, turbulent air flow, back pressure, and air shock noise. Ideally, the air flow through the fins should be smooth and unobstructed so that the heat transfer from the fins and the heat mass to the air flow is optimal. Moreover, when a system fan is used to supply the air flow to two or more heat sinks, the base plate or some other structure that obstructs the air flow can significantly reduce heat transfer from the heat mass and fins to the air flow.

Furthermore, many prior heat sink designs resort to a configuration where the heat sink is mounted to an electronic device carried by a PC board or mother board with a resulting horizontal placement of the heat sink that matches a horizontal mounting of the electronic device on the PC board. However, this horizontal placement does not always allow for the aforementioned optimal air flow. Therefore, flexibility in a placement of the heat sink and its fins relative to the air flow is lacking in prior heat sink designs.

Consequently, there is a need for a cooling device with improved thermal conductivity that reduces heat flux concentration. There is also a need for a cooling device that efficiently transfers waste heat from a liquid when the cooling device has a non-optimal orientation. Finally, there exists a need for a cooling device that allows for flexibility in positioning the cooling device to obtain an unobstructed air flow through fins of the cooling device.

SUMMARY OF THE INVENTION

The cooling device of the present invention solves the aforementioned problems of heat flux concentration, non-optimal orientation, and obstructed air flow. The cooling device includes a heat pipe including a first end and a second end, a plurality of twin fins with each twin fin including a root and a pair of vanes extending outward of the root, the vanes are spaced apart to define a slot between the vanes, and each vane includes a leading edge, a trailing edge, and an outer edge. A core includes a plurality of grooves that are adapted to receive the roots of the twin fins. The core also includes a top face, a cavity, a liquid disposed in the cavity, and a plate that is connected with the core. The plate includes an aperture and the heat pipe is connected with the aperture with the first end of the heat pipe positioned in the cavity and in contact with the liquid in the cavity. The cooling device also includes a liquid chamber including a reservoir, a liquid disposed in the reservoir, an aperture, and a base including a mounting surface for thermally connecting the liquid chamber with the component. The heat pipe is connected with the aperture in the liquid chamber and the second end of the heat pipe is positioned in the reservoir and in contact with the liquid in the reservoir.

The aforementioned problems associated with heat flux concentration are addressed by the liquid chamber, the heat pipes, and the core because waste heat thermally conducted into the liquid in the reservoir via the mounting surface is thermally transferred to the liquid in the core via the heat pipe where an air flow through the vanes dissipates the waste heat from the core. The vanes of the twin fins provide a large surface area for the heat in the core to be dissipated by the air flow over vanes. Moreover, there is flexibility in positioning the leading and trailing edges of the vanes so that the air flow can pass through the slots of the vanes unobstructed by any structures, such as the base, for example. Consequently, the problems associated with obstructed air flow are addressed by the cooling device. Another advantage to the flexibility in positioning the twin fins relative to the air flow is that a system fan or the like can be used to supply the air flow.

Additionally, the first and second ends of the heat pipes are immersed in their respective liquids so that the cooling device can be positioned in a non-optimal orientation (e.g. a non-horizontal orientation) and the liquids still cover the ends of the heat pipes to ensure heat transfer from the liquid chamber to the core. Therefore, the problems associated with reduced heat transfer caused by a non-optimal orientation are addressed by the cooling device.

Other aspects and advantages of the present invention will become apparent from the following detailed description, taken in conjunction with the accompanying drawings, illustrating by way of example the principles of the present invention.

BRIEF DESCRIPTION OF THE DRAWINGS

FIG. 5a is a cross-sectional view depicting an insertion of a twin fin into a groove on a core.

FIG. 5b is a top plan view depicting a plate.

FIG. 5c is a cross-sectional view of a plate along a line II—II of FIG. 5b.

FIGS. 8a through 8e are profile views depicting a twin fin.

DETAILED DESCRIPTION

Figure 1A:
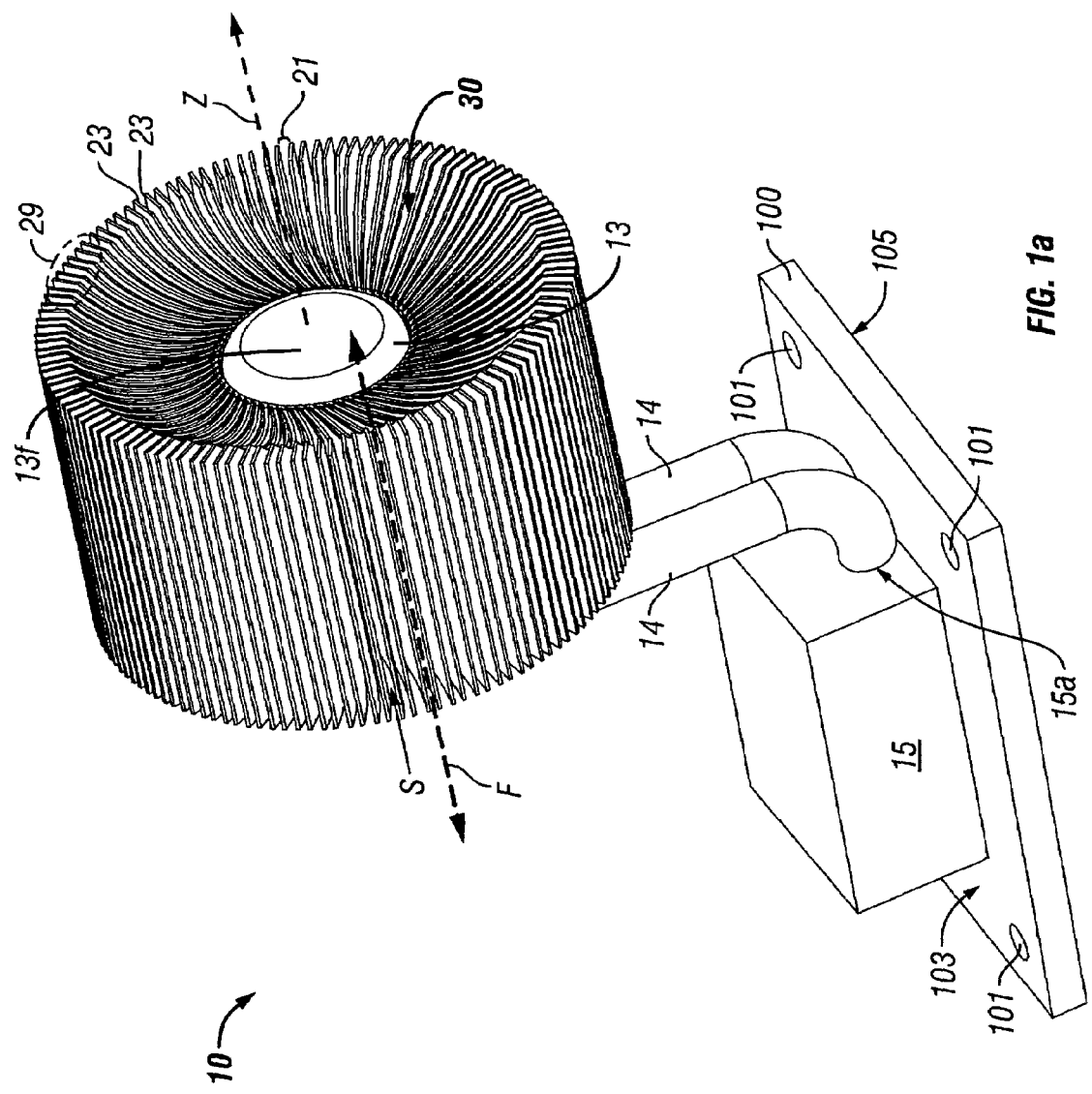
FIGS. 1a and 1b are profile views depicting a cooling device.
Figure 1B:
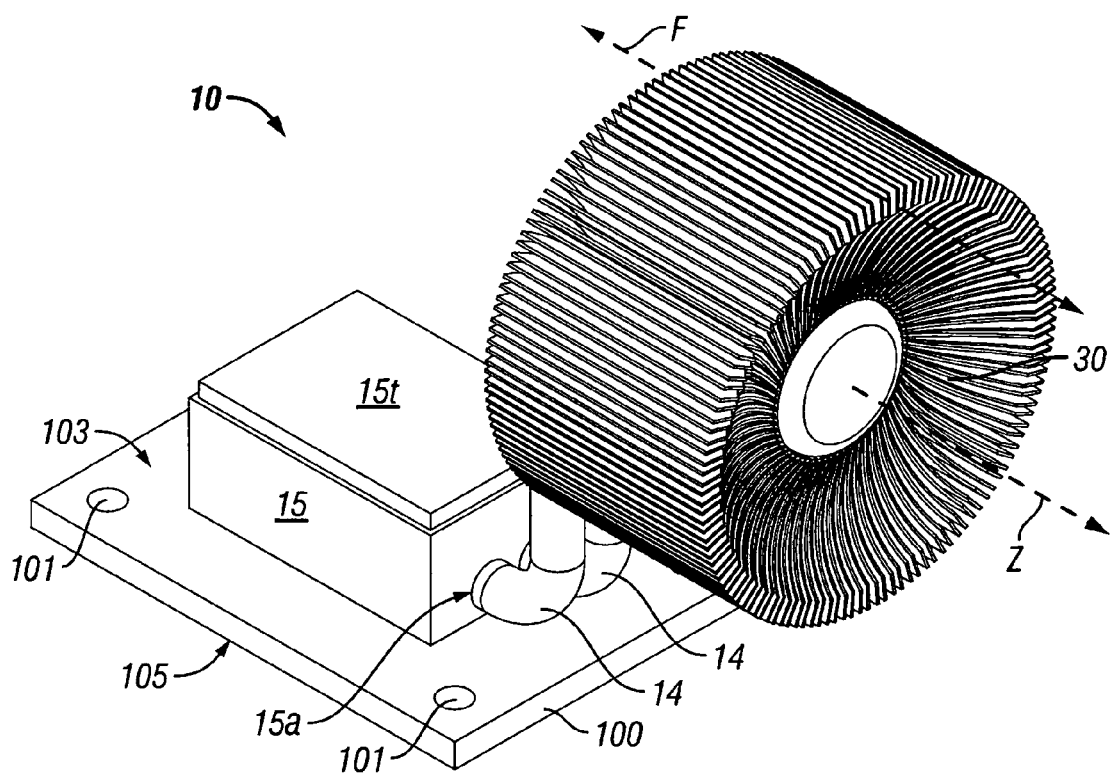

In the following detailed description and in the several figures of the drawings, like elements are identified with like reference numerals.

As shown in the drawings for purpose of illustration, the present invention is embodied in a cooling device for dissipating heat from a component. The cooling device includes a plurality of twin fins with each twin fin including a root and a pair of vanes extending outward of the root. The vanes of the twin fins are spaced apart to define a slot between the vanes and each vane includes a leading edge, a trailing edge, and an outer edge. The cooling device also includes a heat pipe including a first end and a second end, a core including a plurality of grooves that are adapted to receive the root of the twin fins, a top face, a cavity, a liquid disposed in the cavity, and a plate connected with the core and including an aperture. The heat pipe is connected with the aperture in the plate and the first end of the heat pipe is positioned in the cavity and the first end is in contact with the liquid. Additionally, the cooling device includes a liquid chamber including a reservoir and a liquid disposed in the reservoir, an aperture, and a base including a mounting surface for thermally connecting the liquid chamber with the component. The heat pipe is connected with the aperture in the liquid chamber and the second end of the heat pipe is positioned in the reservoir and the second end is in contact with the liquid.

Waste heat from the component is thermally conducted into the liquid in the reservoir via the mounting surface. The heat pipe thermally conducts the heat from the second end to the first end that is in contact with the liquid in the cavity in the core and an air flow over the vanes, through the slots, and over the core dissipates the waste heat into the air flow thereby cooling the component and reducing heat flux concentration in the liquid chamber. The cooling device can be used to dissipate waste heat from any component that requires cooling and the component to be cooled is not limited to electronic devices.

In FIGS. 1a through 1e, a cooling device 10 for dissipating heat from a component (not shown) includes a plurality of twin fins 21 with each twin fin 21 including a root 27 and a pair of vanes 23 extending outward of the root 27 and spaced apart to define a slot S between the vanes 23. Each vane 23 includes, a leading edge 26, a trailing edge 24, and an outer edge 25. The cooling device 10 also includes a heat pipe 14 (two are shown) including a first end 14a and a second end 14b, a core 11 including a plurality of grooves G that are adapted to receive the roots 27 of the twin fins 21, and a top face 13, a cavity 11r, a liquid 11L disposed in the cavity 11r, and a plate 20 connected with the core 11 and including an aperture 20b (two are shown). The heat pipe 14 is connected with the aperture 20b and the first end 14a is positioned in the cavity 11r and is in contact with the liquid 11L. A liquid chamber 15 includes a reservoir 15r and a liquid 15L disposed in the reservoir 15r, an aperture 15a (two are shown), and a base 100 including a mounting surface 105 for thermally connecting the liquid chamber 15 with the component. The heat pipe 14 is connected with the aperture 15a and the second end 14b of the heat pipe 14 is positioned in the reservoir 15r and is in contact with the liquid 15L.

One advantage to the cooling device 10 is that the heat pipes 14 allow for flexibility in positioning the core 11 and the twin fins 21 away from the liquid chamber 15 so that an air flow F can move freely through the vanes 23 from the leading edges 26 to the trailing edges 24 or vise-versa without being impeded by an obstruction such as the base 100, for example. As will be described below, an air flow source such as an axial fan, for example, can be mounted with the vanes 23 to provide the air flow F or the air flow source can be a system fan or the like that provides the air flow F to an entire system that includes the cooling device 10. For example, the heat pipes 14 can be shaped (e.g. the S-shape depicted) so that a axis Z of the core 11 is alined with an air flow $F_S$ from a system fan (see FIG. 18). Therefore, the cooling device 10 allows a designer flexibility in orienting the core 11 at various angles (e.g. above or below a mother board) to suit a design criteria for a specific system and/or to make the best use of available space on a mother board or inside an enclosure that houses the cooling device 10. Furthermore, the flexibility in orientation does not compromise the performance of the cooling device 10.

Figure 1C:
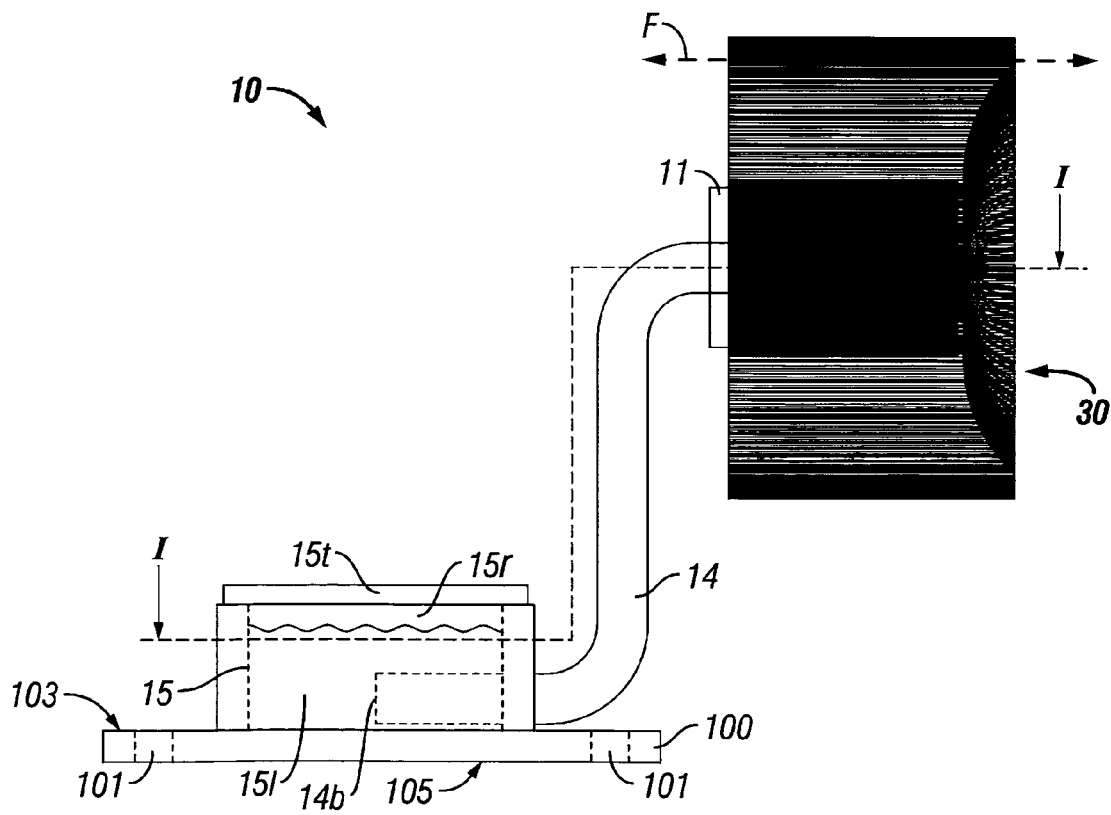
FIG. 1c is a side profile view depicting a cooling device.
Figure 1D:
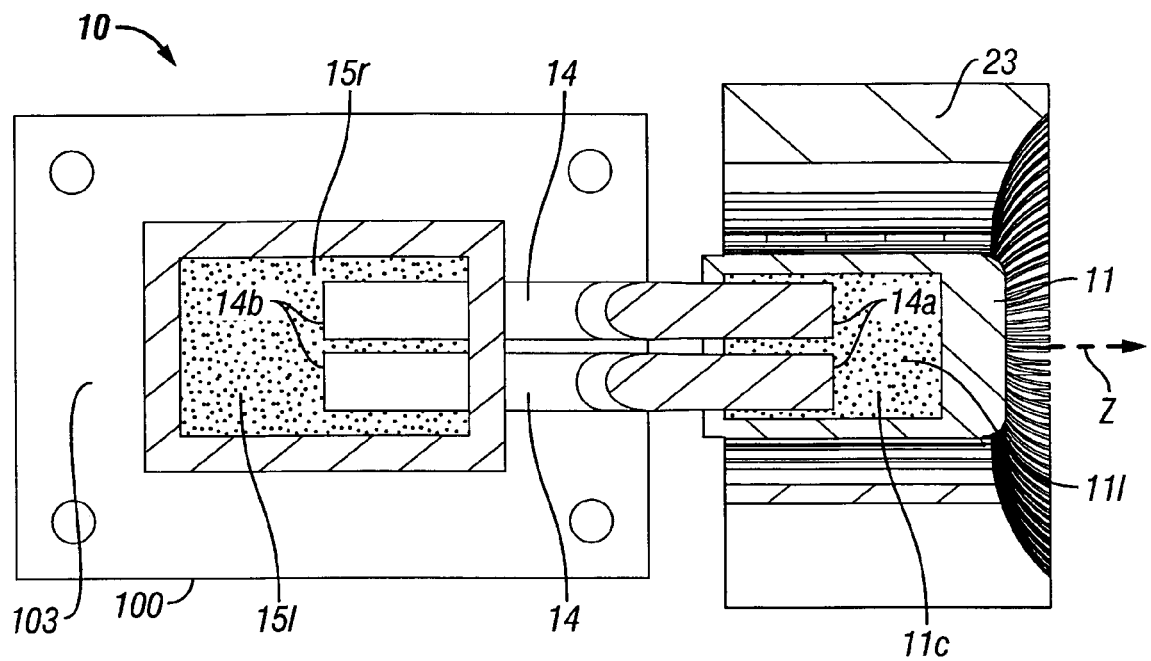
FIG. 1d is a cross-sectional view of a cooling device along a line I—I of FIG. 1c.
Figure 1E:
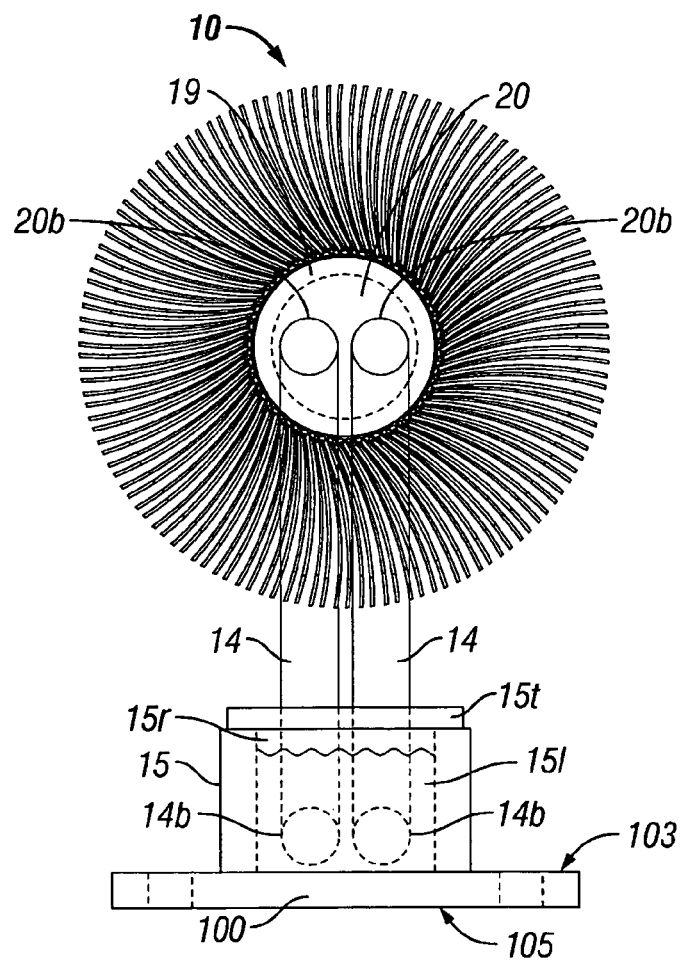
FIG. 1e is a rear profile view depicting a cooling device.

Referring to FIGS. 1c and 1e, the heat pipes 14 can have any shape and are not limited to the S-shape depicted herein. As described above, the heat pipes 14 can be shaped to position the core 11 and the twin fins 21 relative to the air flow F. Therefore, the heat pipes 14 need not extend vertically upward from the liquid chamber 15 as depicted, rather, the heat pipes 14 can include curves, bends, straight sections, and may extend at an angle from the liquid chamber 15. Generally, the heat pipes 14 can be configured to position the core 11 and the twin fins 21 above, below, at an angle, to the sides, or some combination of those positions relative to the liquid chamber 15.

Although the first and second ends (14a, 14b) of the heat pipes 14 can be positioned anywhere inside their respective cavity 11r and reservoir 15r, preferably the heat pipes 14 have their first and second ends (14a, 14b) positioned to maximize heat transfer to/from their respective liquids (11L, 15L). In FIGS. 1c and 1d, the second ends 14b are positioned so that they are in a volume inside the in the reservoir 15r where a heat flux concentration $H_C$ from the waste heat $H_W$ generated by the component will be greatest. As an example, if the heat flux concentration $H_C$ is greatest at a bottom of the reservoir 15r because the bottom is closest to the mounting surface 105, then the second ends 14b should positioned about in the middle of the reservoir 15r and close to the bottom of the reservoir 15r to maximize heat transfer from the liquid 15L to the second ends 14b.

Similarly, for the first ends 14a, it is desirable to efficiently transfer waste heat from the heat pipes 14 to the liquid 11L in the cavity 11r. Accordingly, in FIG. 1d, the first ends 14a are positioned at about a middle of the cavity 11r so that the liquid 11L completely surrounds the first ends 14a. As will be described below, it is preferable for those portions of the heat pipes 14 that are positioned in the reservoir 15r or the cavity 11r to be immersed in the liquids (11L, 15L) so that heat transfer to/from the liquids (11L, 15L) by the heat pipes 14 is maximized. Depending on the position of the first and second ends (14a, 14b) the immersion can be accomplished with a complete or a partial filling of the cavity 11r and the reservoir 15r with the liquids (11L, 15L).

Turning to FIGS. 1a, 1b, 1c, and 1d, the base 100 can include a plurality of mounting holes 101 that extend between a top surface 103 and the mounting surface 105. A fastener (see 65 in FIG. 19), such as a machine screw or a bolt, for example, can be inserted through the mounting holes 101 to effectuate mounting the base 100 to a substrate (e.g. a PC board) that carries the component to be cooled by the cooling device 10 and to position the mounting surface 105 in thermal communication with the component.

Figure 2A:
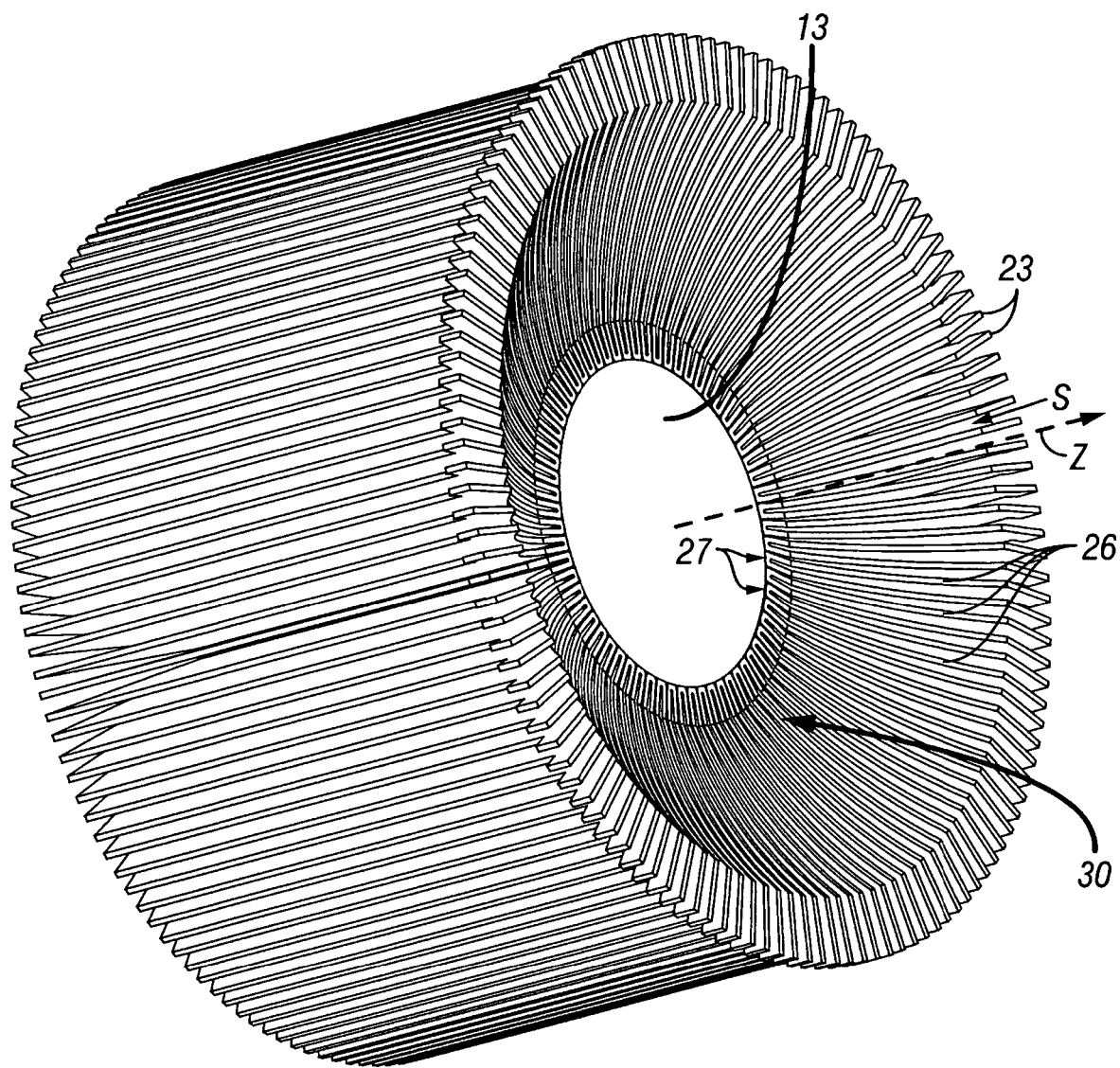
FIGS. 2a and 2b are profile views depicting a plurality of twin fins connected with a core.
Figure 2B:
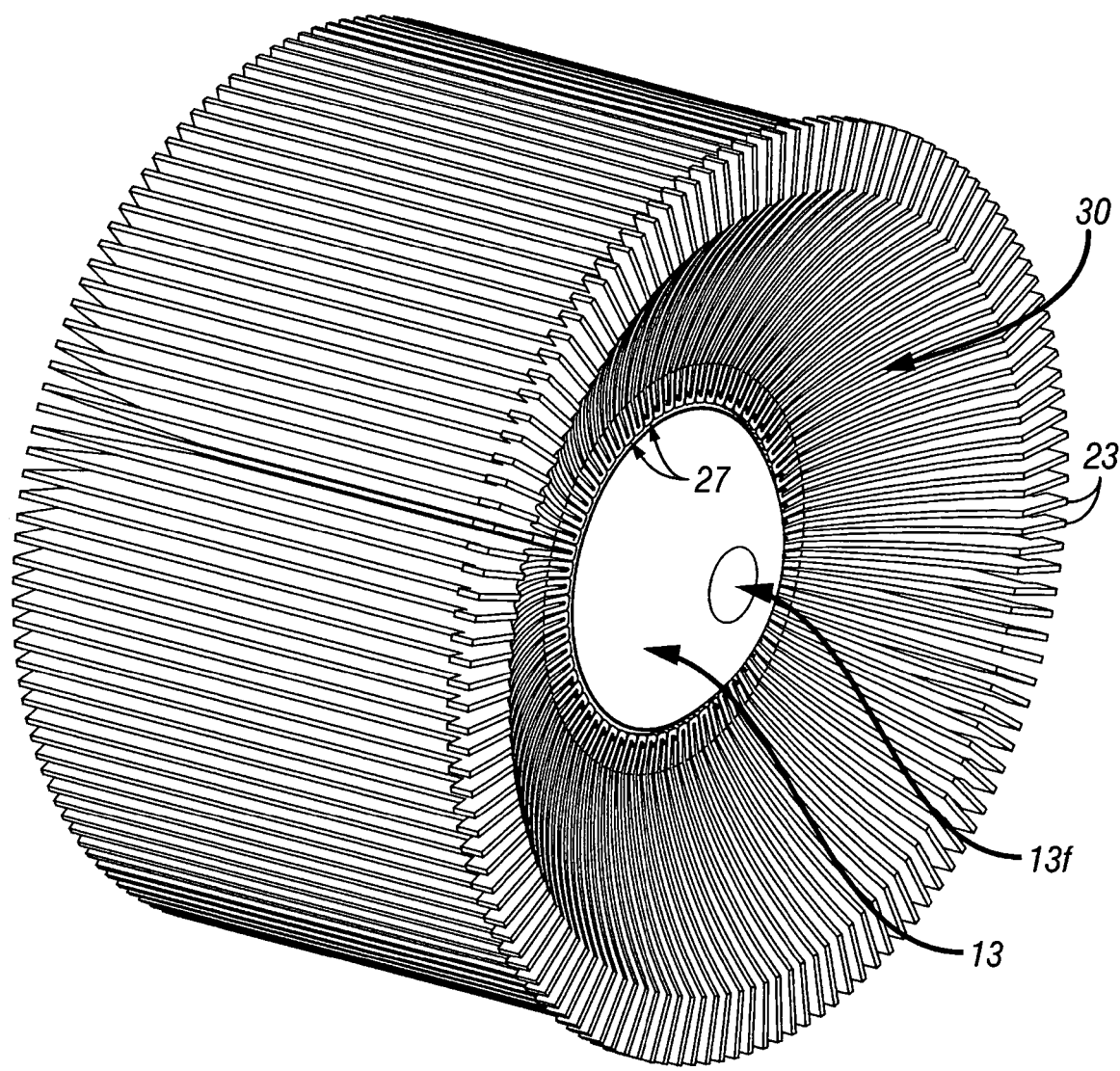
Figure 2C:
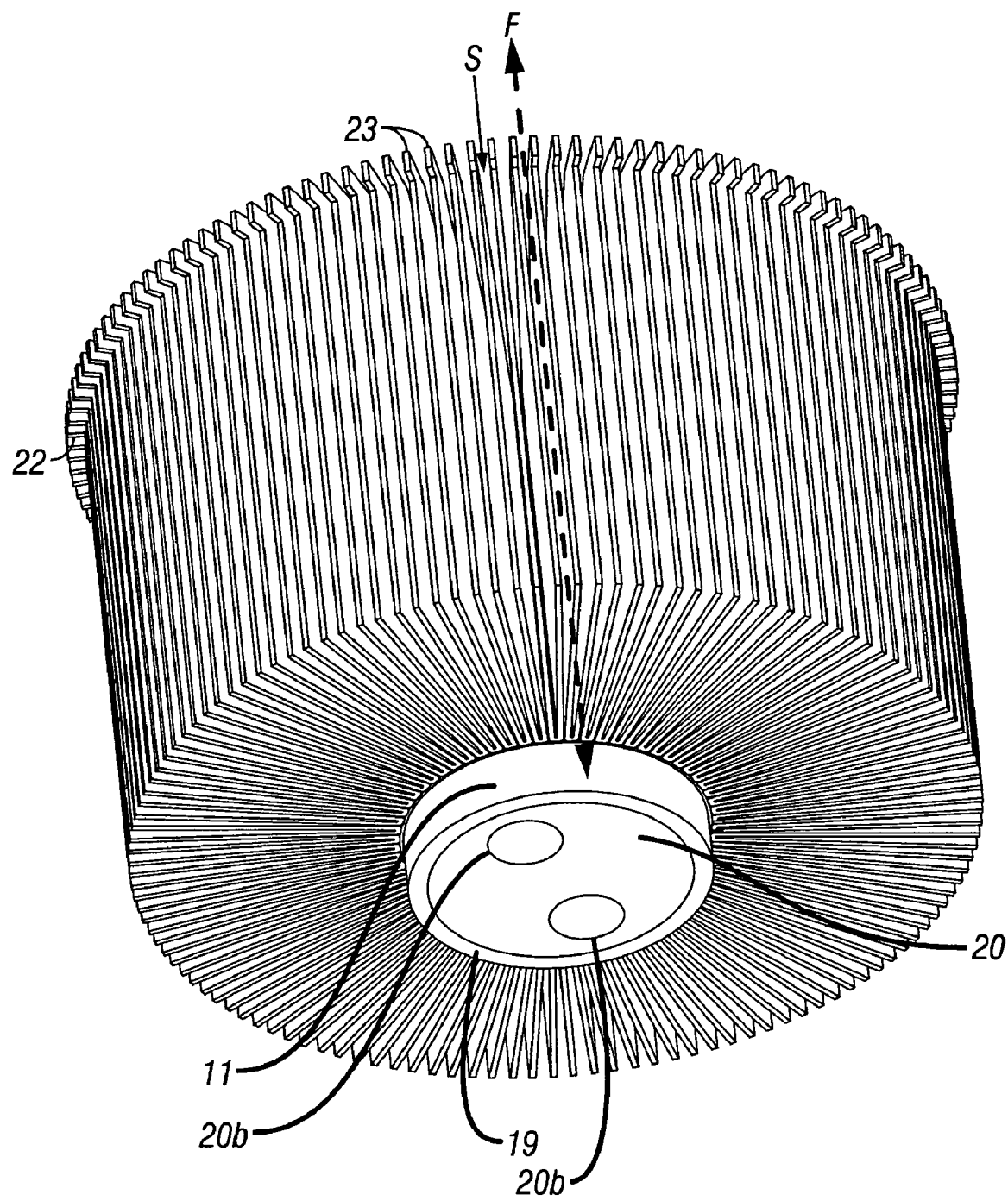
FIG. 2c is a bottom profile view depicting a plurality of twin fins connected with a core.
Figure 3:
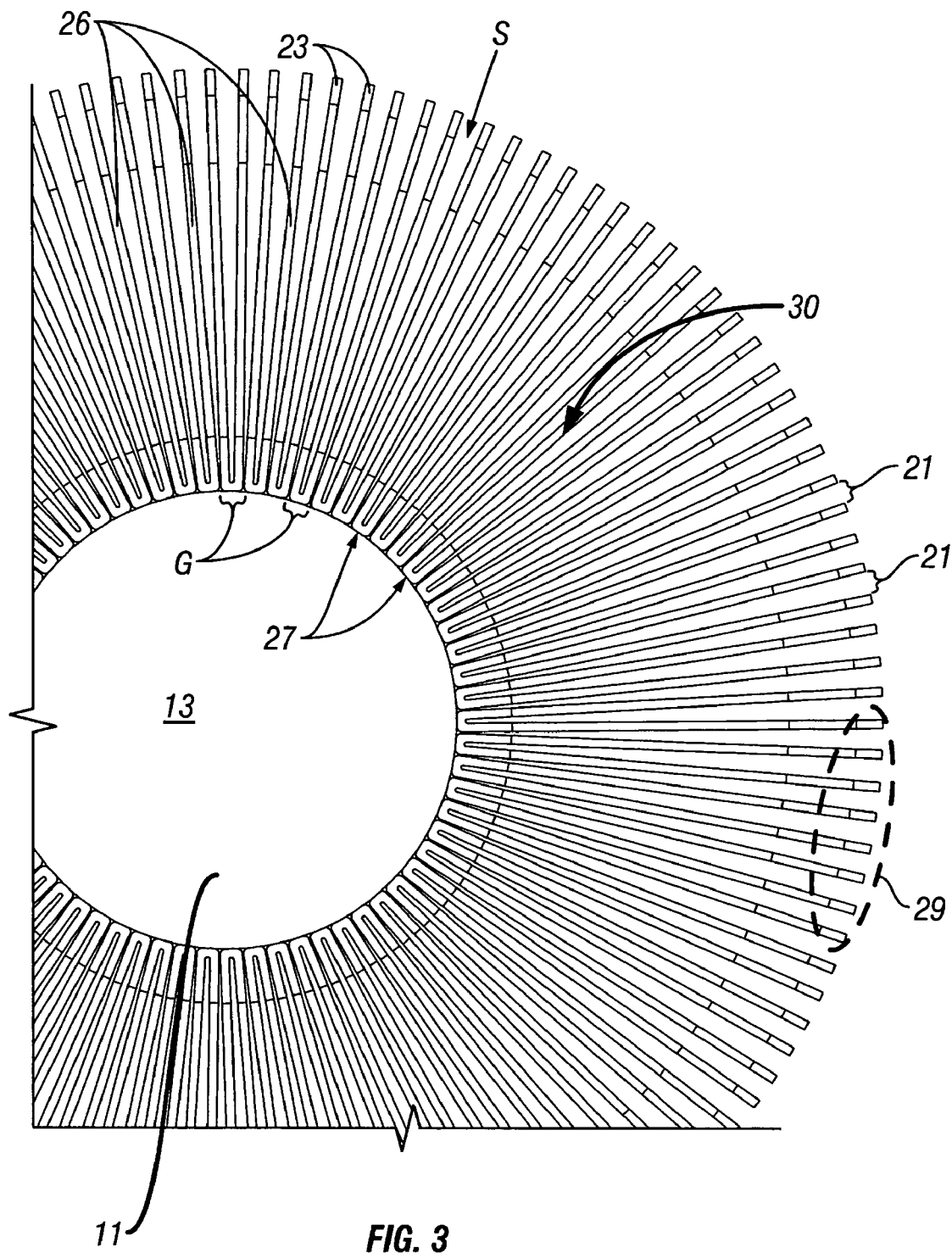
FIG. 3 is an enlarged top profile view depicting a plurality of twin fins connected with a plurality of grooves on a core.

A plurality of twin fins 21 connected with the core 11 sans the heat pipes 14 and liquid chamber 15 are depicted in greater detail in FIGS. 2a, 2b, 2c, and 3. Turning to FIG. 3, a close up view depicts a plurality of the twin fins 21 with their respective roots 27 connected with the grooves G on the core 11 such that the twin fins 21 form an array of fins that surround the core 11. Depending on a profile of the leading edges 26 of the vanes 23, the leading edges 26 can define a chamber 30 that surrounds the top face 13. The top portions 29 of the vanes 23 can be adapted to mount an air flow source to the cooling device 10. For example, the top portion 29 can be a substantially planar surface for mounting a fan to the vanes 23. It is preferable for the leading edges 26 to define the chamber 30 because the chamber 30 provides a space for the air flow F to circulate over the top face 13 to dissipate heat from the core 11 and for the air flow F to pass over the vanes 23 and through the slots S. The top face 13 of the core 11 can be substantially flush with the roots 27 of the twin fins 21 (see FIGS. 2a and 3), can extend outward the roots 23 (see FIG. 2b), or can be positioned below an upper most portion of the roots 27 (see FIG. 17).

In FIG. 2c, a bottom face 19 of the core 11 can include an aperture 19a that extends inward of the bottom face 19 to form the cavity 11r. The plate 20 can be sized to fit in the aperture 19a and then the plate 20 can be connected with the core 11. The apertures 20b are through holes that extend all the way through the plate 20 so that the first end 14a of the heat pipes 14 can be positioned in the cavity 11r by inserting the first ends 14a through the apertures 20b.

Figure 4:
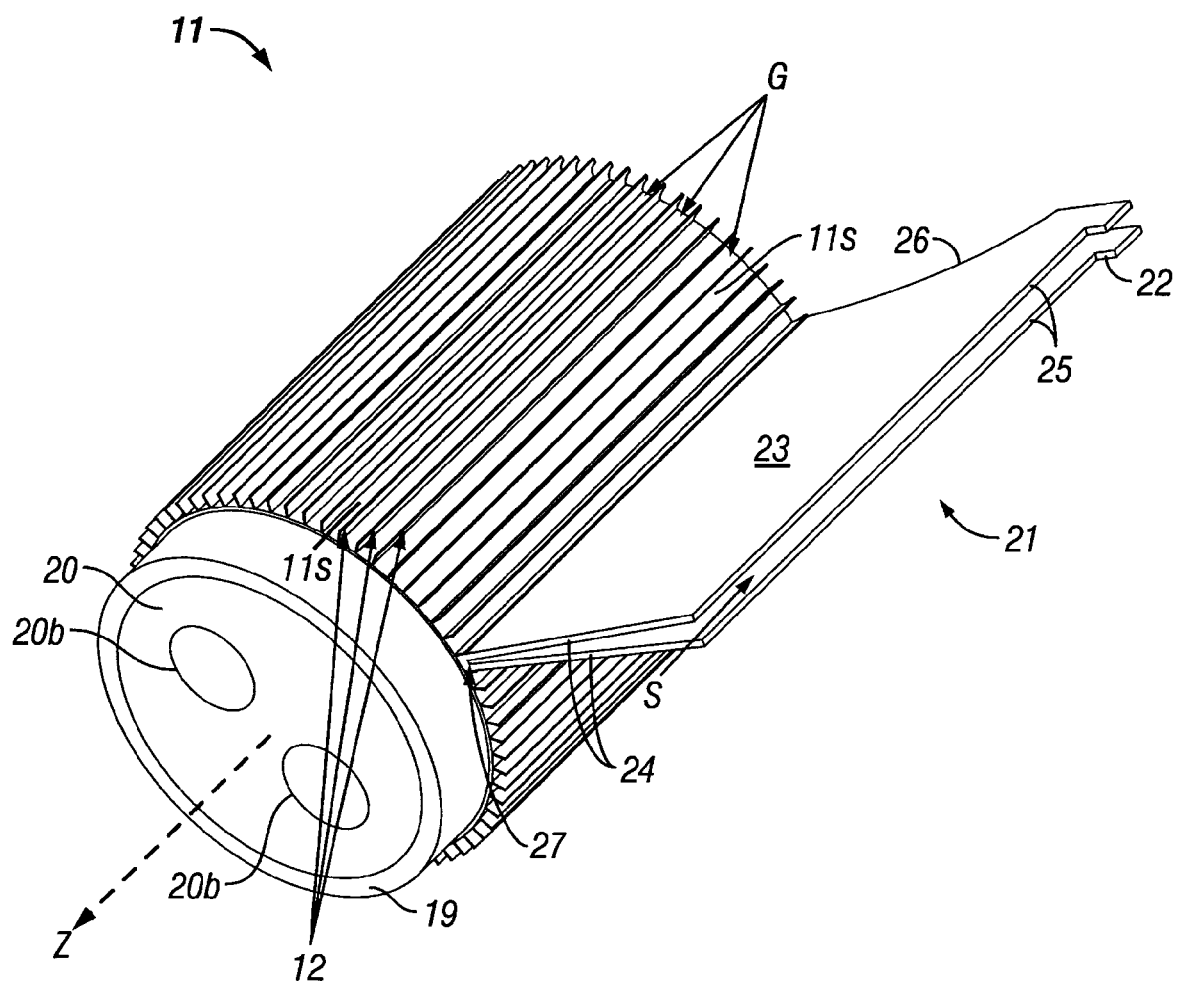
FIG. 4 is a profile view depicting a twin fin connected with a core.

Turning to FIG. 4, the grooves G are adapted to receive the root 27 of the twin fins 21. The grooves G can be formed by a pair of spaced apart projections 12 that extend outward of a surface 11s of the core 11. A space between adjacent projections 12 is sufficient to receive a width 27w of the root of the twin fin 21. Alternatively, in FIG. 5a, the groove G can extend inward of the surface 11s and the groove G can include a width and a depth sufficient to receive the root 27 of the twin fins 21. As will be described below, the grooves G can be aligned with the axis Z of the core 11 or the grooves G can be aligned at an angle with the axis Z (see β in FIG. 7a). Factors including a size of the core 11 (e.g. its circumference if the core 11 is cylindrical) and the width 27w of the roots will determine a maximum number of the twin fins 21 that can be connected with the core 11. The root 27 can be inserted into the groove G using a tool 90. The tool 90 can complement a shape of the slot S and the tool 90 can be used to urge the root 27 into the groove G so that the root 27 is firmly connected with the groove G and the root 27 is in contact with the groove G substantially over its entire length along the core 11. As an example, the twin fin 21 can be fixedly connected with the groove G by applying a solder or the like to the root 27 and/or the groove G prior to insertion, then the root 27 can be soldered in the groove G. The tool 90 can be used to hold the root 27 in the groove G to prevent the twin fin 21 from moving during the insertion process.

Similarly, a brazing process can be used to connect the root 27 with the groove G. To enhance thermally conductivity between the core 11 and the twin fin 21, a thermal sealant or a thermal interface material can be positioned in the groove G and/or on the root 27 prior to insertion. Although not depicted in FIG. 5a, the above processes can be used when the groove G is formed by the projections 12 depicted in FIG. 4. Other methods can be used to connect the root 27 with the groove G and the present invention is not to be construed as being limited to the methods disclosed herein. For instance, welding, vacuum brazing, adhesives, and glue are examples of other methods that can be used to effectuate a connection of the roots 27 with the grooves G.

In FIGS. 5b and 5c, the plate 20 can include at least one aperture 20b that extends all the way through the plate 20. A perimeter 20p of the plate can have a shape that complements a shape of the aperture 19a in the bottom face 19 of the core 11. The plate 20 and the core 11 will have a shape that is application dependent and need not have the circular and the cylindrical shapes respectively as depicted herein. Similarly, the apertures 20b will have a shape that depends on the shape of the heat pipes 14. Accordingly, the apertures 20b need not be circular as depicted. The plate 20 can be made from any material (e.g. a metal) that can be soldered, brazed, or welded. Materials including but not limited to carbon steel, aluminum (Al), ADC12 aluminum (Al), copper (Cu), and silver (Ag). A process including but not limited to pressure die casting, punching and shaving, forging, and machining can be used to form the plate 20 and the apertures 20b. For example, a rod of metal starting material can be turned on a machine tool to form the plate 20, followed by drilling the plate 20 to form the apertures 20b.

Figure 6A:
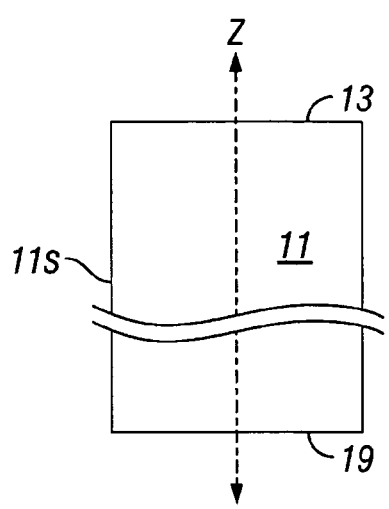
FIGS. 6a through 6g are cross-sectional views depicting a core and examples of profiles of a top face of the core.
Figure 6B:
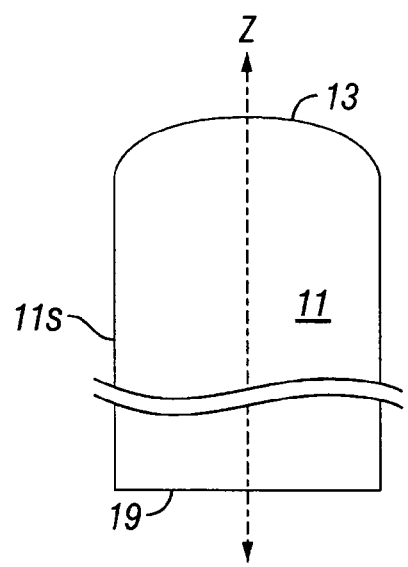
Figure 6D:
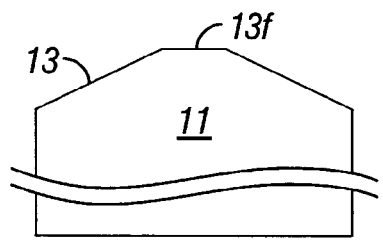
Figure 6C:
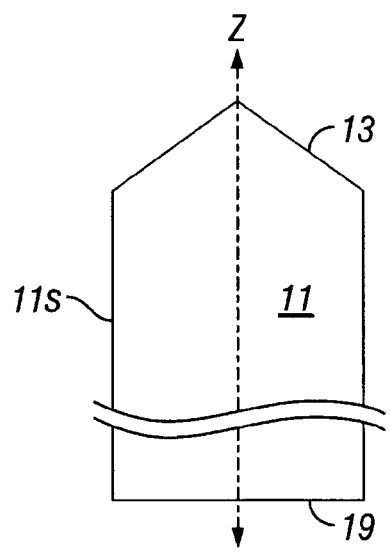
Figure 6E:
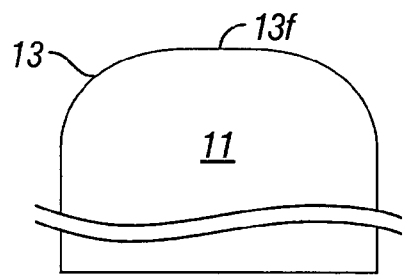
Figure 6G:
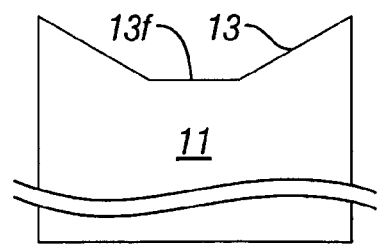
Figure 6F:
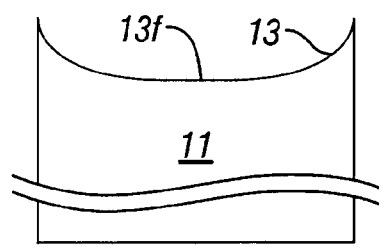

In FIGS. 6a through 6g, examples of various configurations for the top face 13 of the core 11 are depicted. The top face 13 can include a planar profile in FIG. 6a, an arcuate profile in FIG. 6b, and a sloped profile in FIG. 6c. In FIGS. 6d and 6e, the sloped and arcuate profiles can terminate in a frustum 13f (see 13f in FIG. 2b). In FIGS. 6f and 6g, the top face 13 includes concave arcuate and concave sloped profiles respectively, and those profiles can include the frustum 13f. The profile of the top face 13 can be selected based on air flow management in the chamber 30 and/or to increase the air flow F over the top face 13 to enhance heat transfer from the core 11 to the air flow F.

Figure 7A:
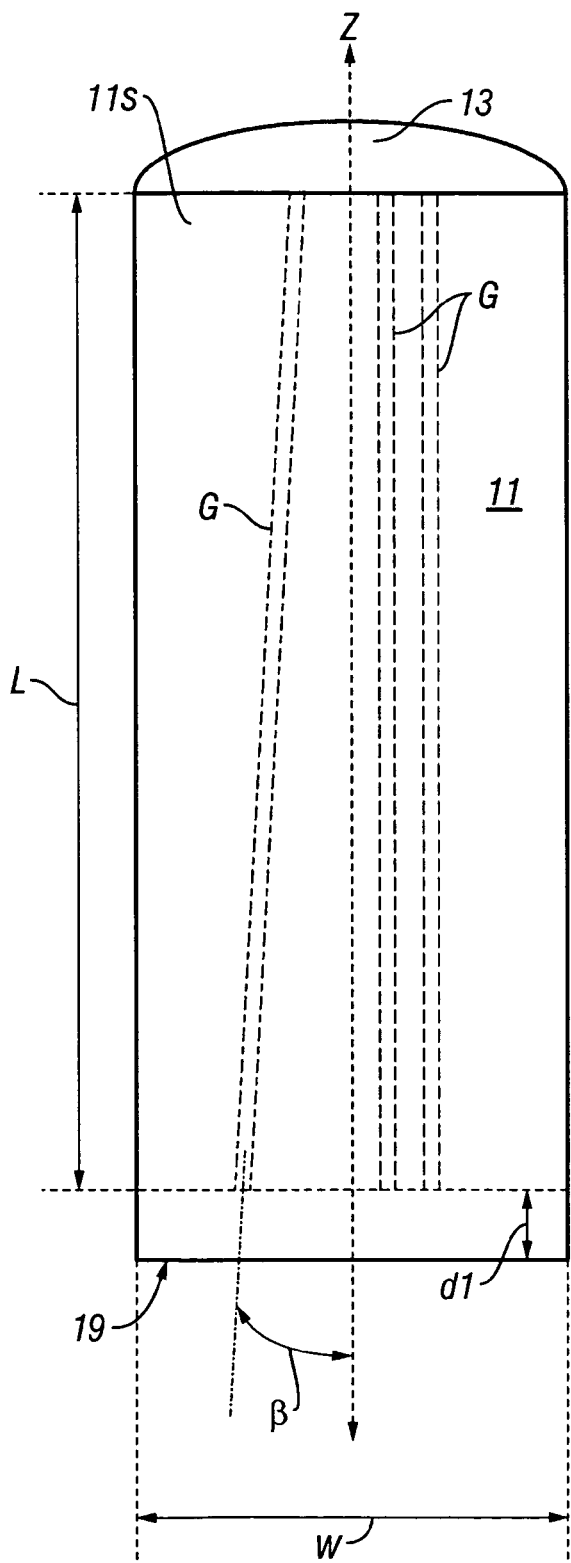
FIG. 7a is a side profile view depicting a core including a plurality of grooves.

Turning to FIG. 7a, the grooves G can include a length L that substantially spans an entirety of a length of the surface 11s of the core 11. The root 27 of each twin fin 21 can have a length that is substantially equal to the length L of the grooves G. In FIG. 7a, the grooves G come short of extending all the way down to the bottom face 19 by a distance d1. The distance d1 can be 5.0 mm or less, for example. Accordingly, the length L spans a substantial entirety of the surface 11s. The grooves G can be aligned with the axis Z of the core 11 or the grooves G can have an angular orientation β with the axis Z.

Figure 7B:
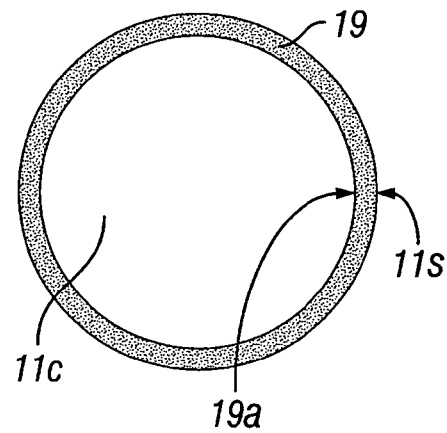
FIG. 7b is a bottom plan view of a cavity in a core.
Figure 7C:
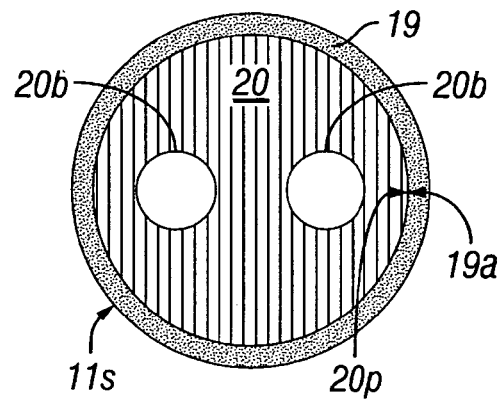
FIG. 7c is a bottom plan view of a plate connected with a core.

In FIG. 7b, as one example of how the cavity 11r can be formed in the core 11, the bottom face 19 can include the aperture 19a that extends inward of the bottom face 19 to form the cavity 11r. In FIG. 7c, the plate 20 is connected with the core 11 by inserting the plate 20 in the aperture 19a. The aperture 19a and the perimeter 20p of the plate 20 can be sized appropriately to provide a proper mechanical fit between the plate 20 and the core 11. The connection of the plate 20 with the core 11 and the connection of the heat pipes 14 with the apertures 20b in the plate 20 should be leak proof to prevent the liquid 11L from leaking out of the cavity 11r via the apertures (19a, 20b). The plate 20 can be connected with the core 11 and the heat pipes 14 can be connected with the apertures 20b using a process including but not limited to soldering, brazing, welding, and friction stir welding.

In FIGS. 8a through 8e, each twin fin 21 includes a root 27 that is common to both vanes 23, an outer edge 25, a trailing edge 24, a leading edge 26. Optionally, the vane 23 can include a lip 22 that extends outward of the outer edge 25 and the van can include a top portion 29. The lip 22 provides a surface against which a mounting ring (see 80 in FIG. 15) is abutted with for connecting an air flow source with the cooling device 10; whereas, the top portion 29 is operative to provide a surface upon which to mount the air flow source on the vanes 23. The leading edge 26 of the vane 23 can include a profile that is straight (i.e. planar), arcuate, sloped, or a composite profile that is combination of one or more of the aforementioned profiles (see FIGS. 8a and 8b). The profile can be selected to control the air flow F in the chamber 30, over the top face 13, over the vanes 23, and through the slots S. The profile may also be selected to complement a shape of a fan blade that is positioned proximate the chamber 30 to provide the air flow F. Although the trailing edge 24 is depicted as being substantially planar, the trailing edge 24 may also be profiled and can include a straight, an arcuate, a sloped, or a composite profile. The slots S between the vanes 23 can diverge from the root 27 to the outer edge 25 so that the slot S widens in a direction from the root 27 to the outer edge 25.

The root 27 and a portion 27c (see dashed lines) of the vanes 23 may be coated with a material including but not limited to an adhesive, a glue, a solder, or a brazing compound to effectuate a connection of the twin fins 21 with the grooves G in the core 11. Because the portion 27c will come into contact with the projections 12 (see FIG. 4) or a wall of the groove G (see FIG. 5a), it may be desirable to coat the portion 27c with the aforementioned materials to ensure the twin fin 21 is fixedly connected with the core 11. Thermal transfer of waste heat $H_W$ from the core 11 to the twin fins 21 can be reduced if the connection between the root 27 and the groove G is not snug and/or any portion of the root 27 is not in contact with the core 11. As was described above, a width 27w of the roots 27 should be selected to complement the inside dimensions of the grooves G or the projections 12 to ensure a snug fit.

Figure 9A:
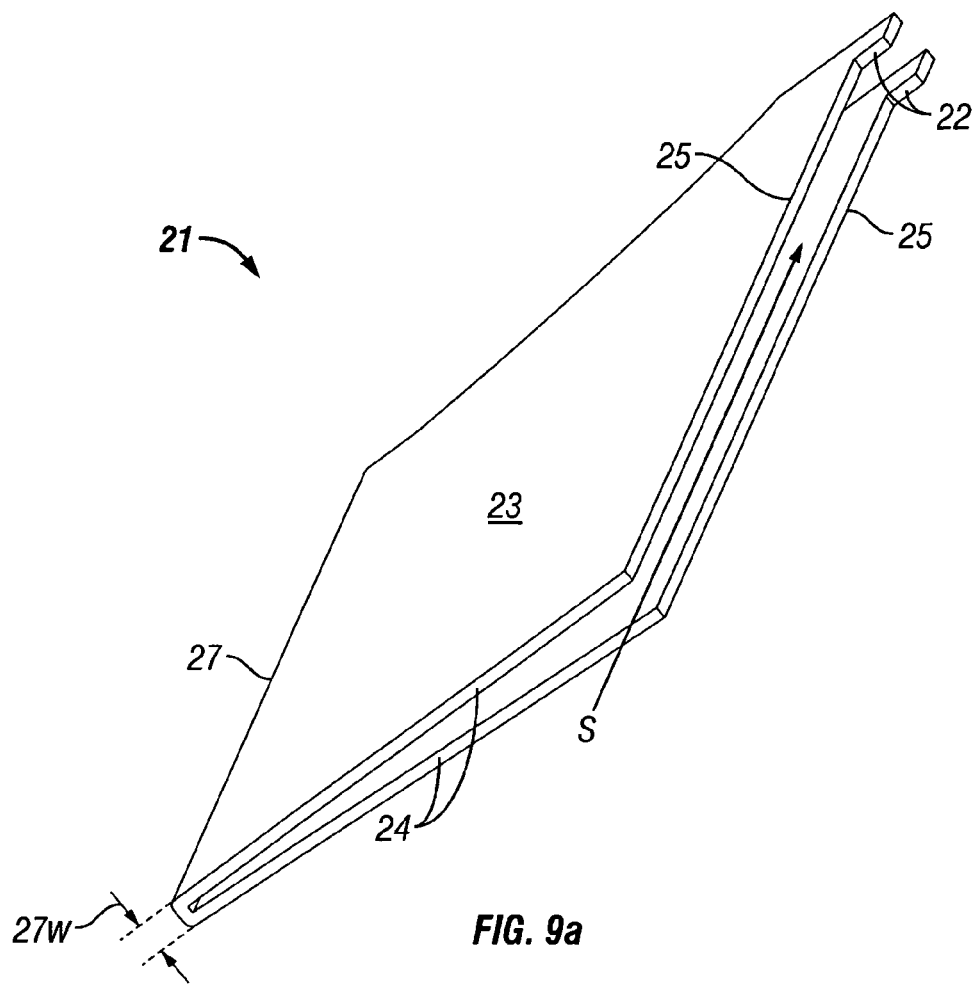
FIGS. 9a and 9b are profile views depicting a vane of a twin fin.
Figure 9B:
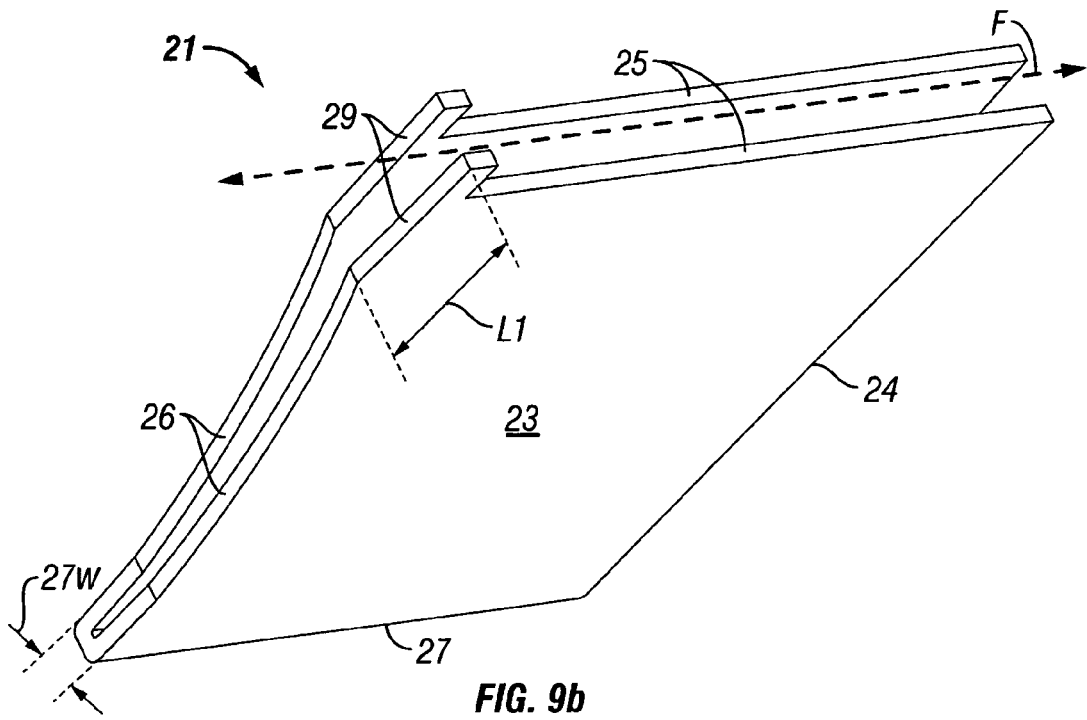
Figure 10A:
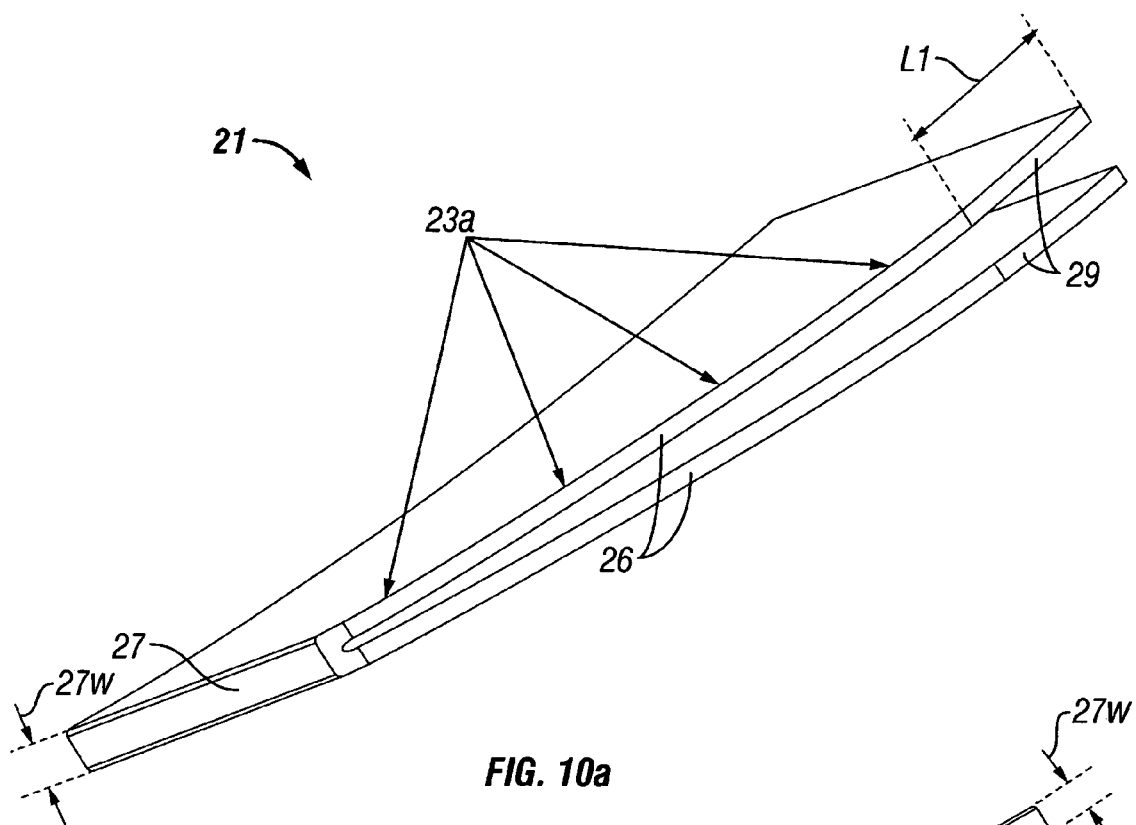
FIGS. 10a and 10b are profile views depicting an arcuate profile on vane.
Figure 10B:
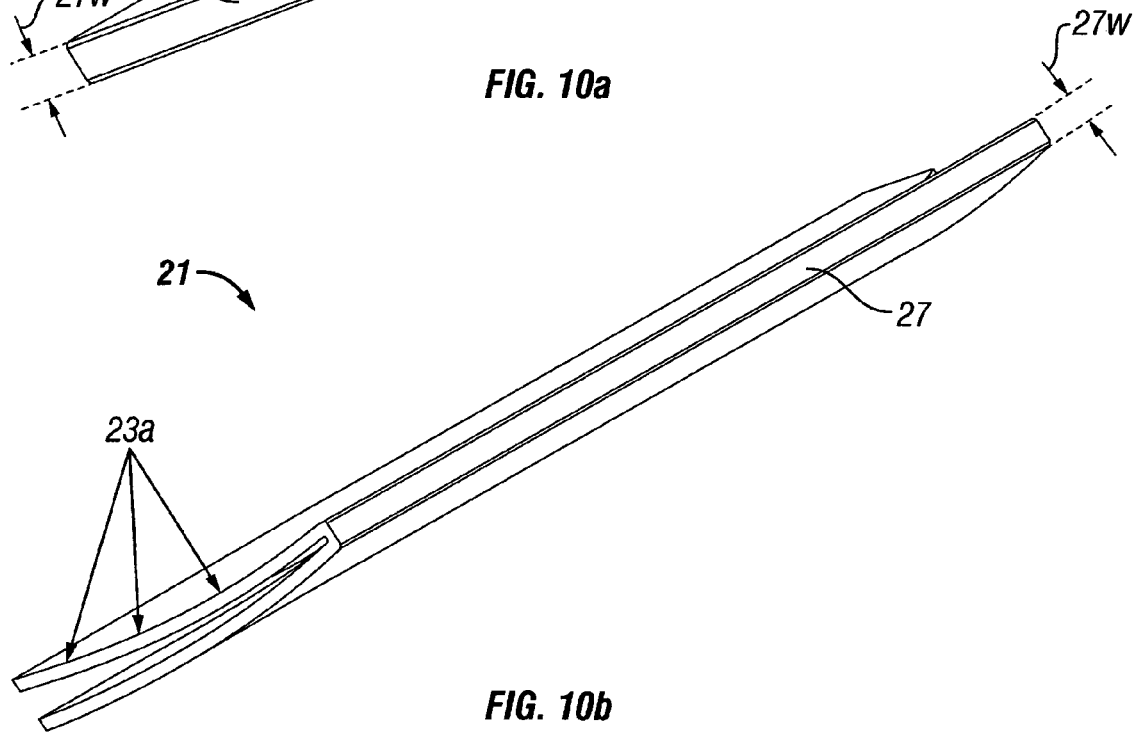

In FIGS. 9a and 9b, the vanes 23 of the twin fins 21 include a planar profile, that is, each vane 23 is a substantially flat surface from the root 27 to the outer edge 25. On the other hand, in FIGS. 10a and 10b, the vanes 23 include an arcuate profile denoted by arrows 23a. The vanes 23 can also include an angular profile (see FIG. 8e) wherein the vanes 23 have one or more portions that are at an angle α with respect to another portion of the vane 23 or with respect to some predetermined reference point on the twin fin 21 or on the core 11. The arcuate profile 23a depicted in FIGS. 10a and 10b can be selected to be tangential to a point on the core 11, such as a circle of a predetermined diameter and centered about the axis Z of the core 11. As an example, the arcuate profile 23a can be selected to match a curvature of a fan blade (not shown) on a fan that is mounted over the chamber 30. Matching a curvature of the vanes 23 with a curvature of the fan blade can result in lower air shock noise caused by the air flow F moving over the vanes 23 and through the slot S.

Figure 11:
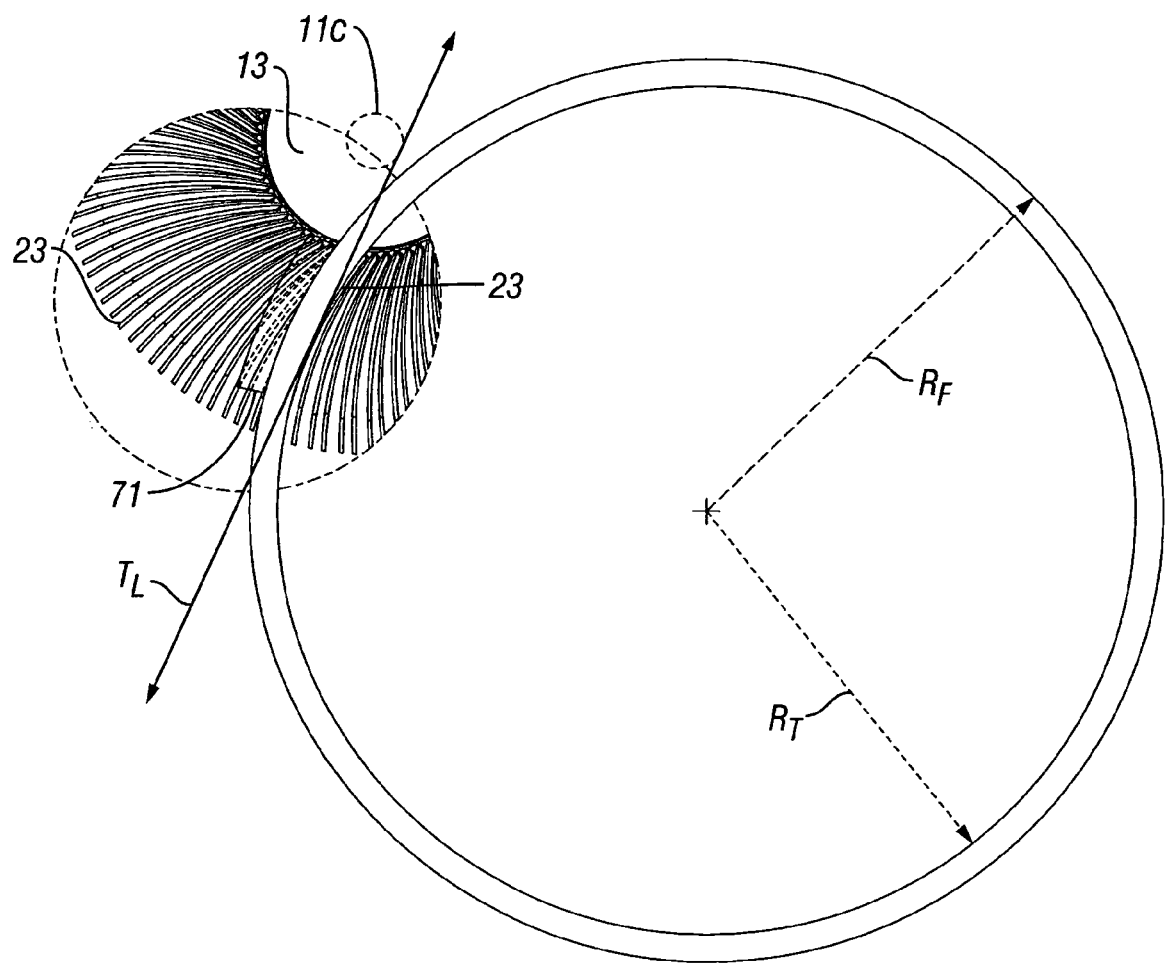
FIG. 11 depicts a tangential relationship between a curvature of a vane and a curvature of a fan blade.

Turning to FIG. 11, a circle 11c centered about the axis Z of the core 11 has a tangent line $T_L$ that is tangent to the circle 11c and is tangent to a curvature of the arcuate profile 23a of vanes 23 as denoted by a second circle having a radius $R_T$ that is equal to a distance from the root 27 to the outer edge 25 of the vanes 23. A second circle having a radius $R_F$ represents a radius of a fan blade 71 (shown superimposed over the vanes 23) from a center of a hub of a fan (not shown). The curvature of the fan blade 71 matches the arcuate profile 23a of the vanes 23 such that the two circles defined by radius lines ($R_T$ and $R_F$) are concentric with each other.

Figure 12:
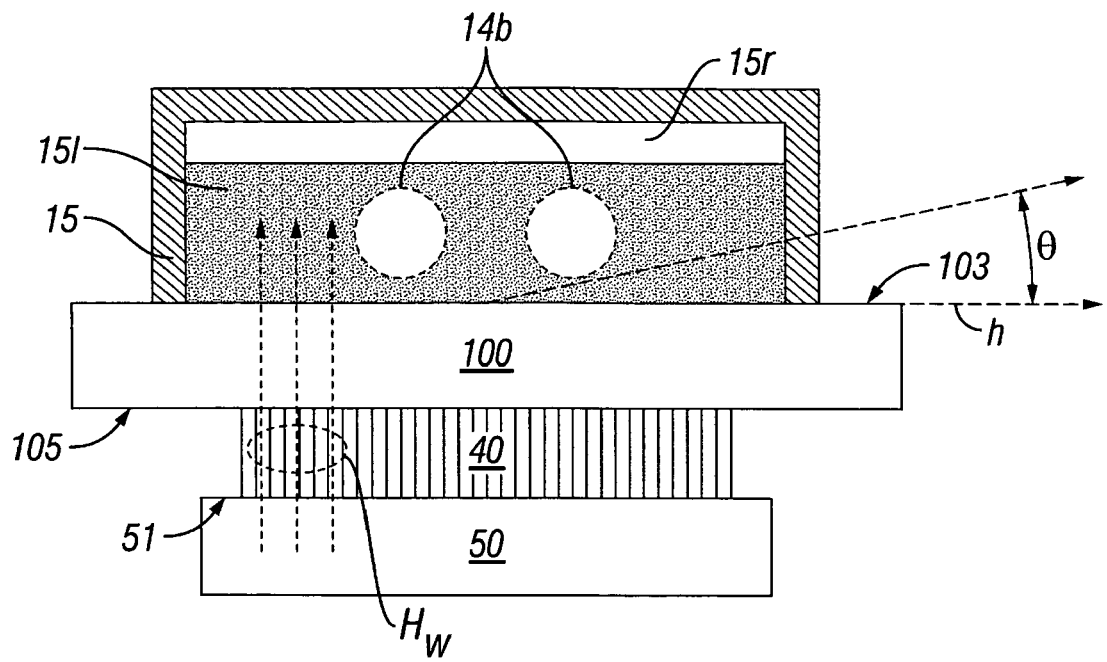
FIGS. 12 and 13 are cross-sectional views depicting a liquid in a reservoir and a thermal interface material.

In FIG. 12, a thermal interface material 40 can be positioned on the mounting surface 105 of the base 100. The thermal interface material 40 reduces thermal resistance between a surface 51 of a component 50 and the mounting surface 105. The thermal interface material 40 can also serve to seal micro voids on the surface 51 thereby increasing waste heat $H_W$ transfer from the component 50 to the liquid 15L in the reservoir 15r. Alternatively, in FIG. 13, the mounting surface 105 of the base 100 can include a cavity 18 inset from the mounting surface 105. A thermal interface material 40 can be positioned in the cavity 18. The thermal interface material 40 can be flush with the mounting surface 105, can be inset from the mounting surface 105 (i.e. recessed into the cavity 18) or can extend outward of the mounting surface 105.

As one example of how the liquid chamber 15 can be implemented, the liquid chamber 15 can be a structure that is open at one end (see FIG. 12) and the open end is positioned in contact with a top surface 103 of the base 100 and is connected with the top surface 103 using a process including but not limited to welding, soldering, brazing, or friction stir welding. The apertures 15a can be formed by a process including but not limited to drilling, milling, machining, punching, or they can be cast or otherwise molded into the liquid chamber 15. The reservoir 15r can then be filled with the liquid 15L by pouring the liquid 15L into the reservoir 15r via the apertures 15a.

Figure 13:
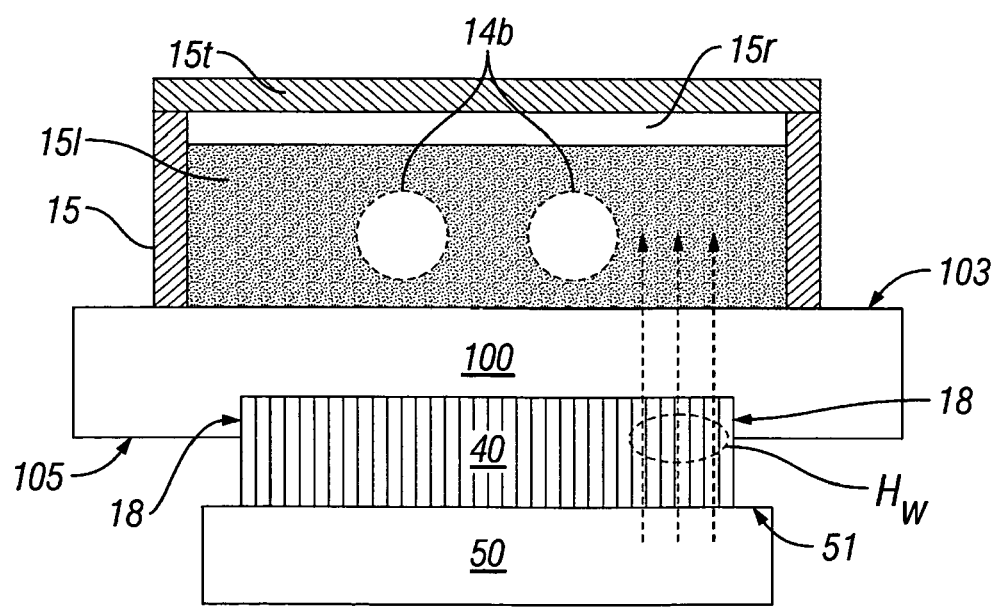

In contrast, in FIG. 13, as another example of an implementation of the liquid chamber 15, the liquid chamber 15 can be a structure that is open at two ends with one end connected with the top surface 103 and a lid 15t can be connected with the other end to form the reservoir 15r. The liquid 15L can be added prior to the connection of the lid 15t or after the connection of the lid 15t by pouring the liquid 15L through the apertures 15a as described above. The liquid chamber 15 can be connected with the top surface 103 and the lid 15t can be connected with the liquid chamber 15 using the aforementioned processes. As was described above in reference to the cavity 11r, the liquid chamber 15 must be sealed so that it is leak proof.

Preferably, the second ends 14b of the heat pipes 14 are completely immersed in the liquid 15L so that the waste heat $H_W$ in the liquid 15L is transferred to the heat pipes 14 even when the liquid chamber 15 has an orientation other than horizontal. For example, the cooling device 10 may be connected with a component on a PC board and the PC board may not be perfectly level (i.e. horizontal) or a chassis that carries the PC board may not be perfectly level. Therefore, it is desirable for the second ends 14b to be completely immersed in the liquid 15L so that a tilting θ of the liquid chamber 15 relative to a horizontal line h does not result in the liquid 15L shifting out of contact with the second ends 14b thereby compromising heat transfer from the liquid 15L to the heat pipes 14. The reservoir 15r may be completely filled or partially filled by the liquid 15L.

Depending on the material used for the liquid 15L and the expected maximum temperature generated by the component, it may be desirable to partially fill the reservoir 15r with the liquid 15L to accommodate for thermal expansion of the liquid 15L and to prevent the thermal expansion from rupturing the liquid chamber 15 or causing the liquid 15L to leak out of the liquid chamber 15. Typically, a manufacture will set an upper operating limit on a component (e.g. not to exceed 75° C.); therefore, the liquid 15L can be selected with that upper limit in mind so that any thermal expansion of the liquid can be predicted. Generally, the reservoir 15r should be filled with a volume of the liquid 15L sufficient to at least completely immerse the heat pipes 14. Furthermore, the closer the heat pipes 14 are placed towards the bottom of the reservoir 15r (i.e. closer to the top surface 103), then a smaller volume of the liquid 15L will be required to immerse the heat pipes 14 and the reservoir need not be completely filled.

Similarly, the liquid 11L in the cavity 11r at a minimum should completely immerse the heat pipes 14 and the cavity 11r can be completely or partially filled with the liquid 11L. However, unlike the reservoir 15r where the waste heat $H_W$ is transferred to the liquid 15L, it is preferable to completely fill the cavity 11r with the liquid 11L in order to maximize the surface area of the liquid 11L that is in contact with the cavity 11r and therefore in contact with the core 11 because the cavity 11r is formed in the core 11.

Figure 14B:
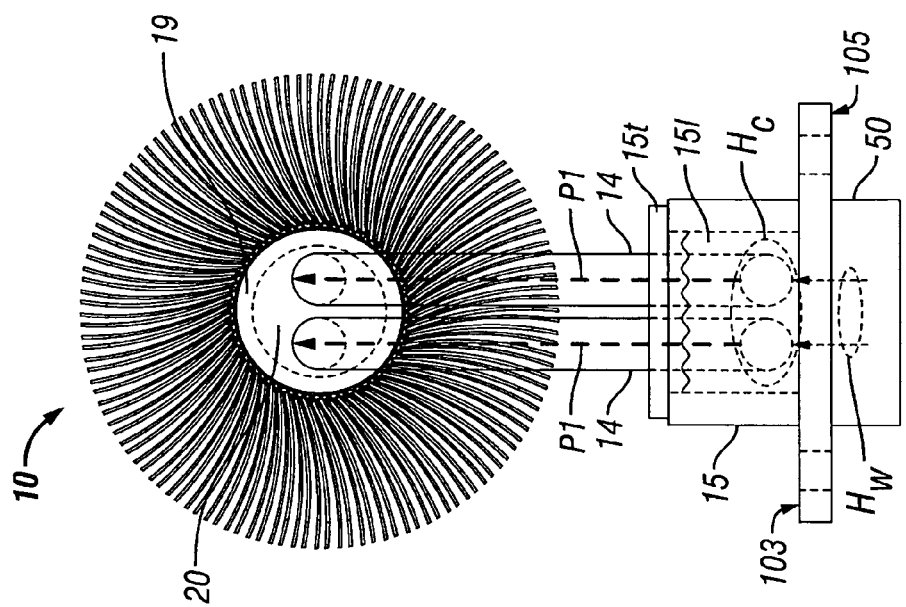
FIGS. 14a and 14b are cross-sectional views depicting a heat transfer path.
Figure 14A:
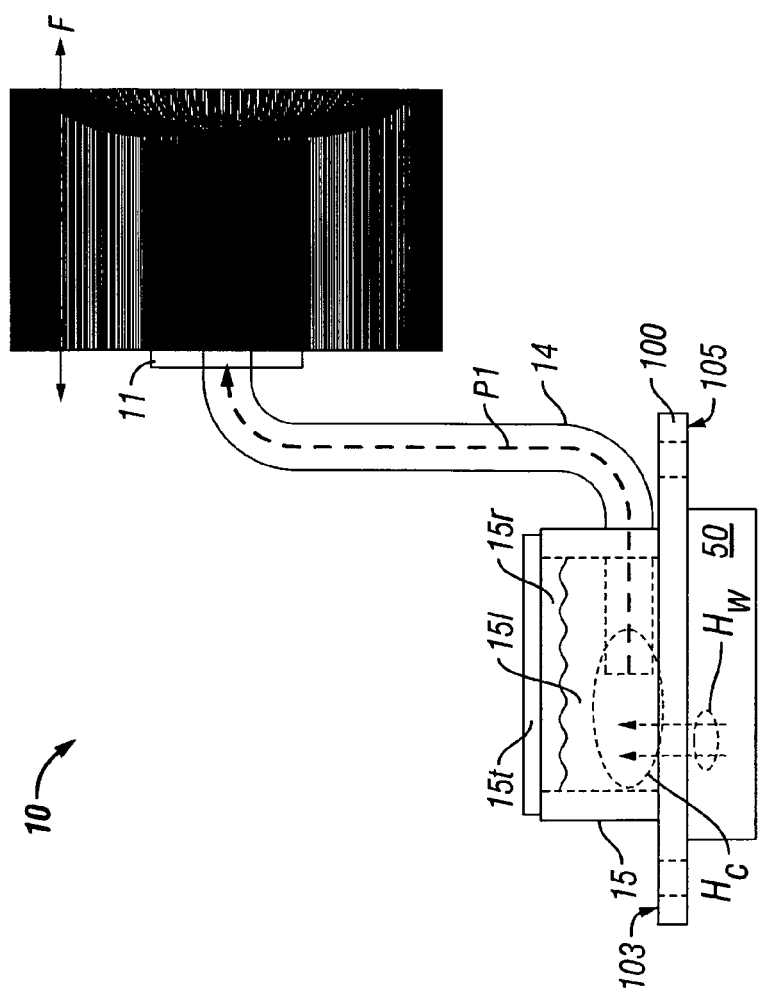

In FIGS. 14a and 14b, a component 50 is in thermal communication with the mounting surface 105. The thermal communication can be by a direct contact between the component 50 and the mounting surface 105 as depicted or via an intermediate structure such as the aforementioned thermal interface material 40, for example. Waste heat $H_W$ enters the liquid chamber 15 via the mounting surface 105 and is concentrated near the base 100 where the heat pipes 14 are positioned in the reservoir 15r. Even though the waste heat $H_W$ is thermally conducted throughout a volume of the liquid 15L, a heavy dashed oval depicts a region in the liquid chamber 15 where a heat flux concentration $H_C$ is highest.

The heat flux concentration $H_C$ can be particularly problematic when the component 50 is a high power dissipation, state-of-the-art, microprocessor such as the type used in leading edge workstations, desk top PC's, servers, and laptop computers. To efficiently cool the component 50 it is desirable to reduce the heat flux concentration $H_C$ in the liquid chamber 15. To that end, the waste heat $H_W$ is thermally transferred from the liquid chamber 15 through the heat pipes 14 and into the core 11 through a path P1. The path P1 begins where the waste heat $H_W$ in the liquid 15L is transferred to the heat pipes 14 via the second ends 14b and continues through the heat pipes 14 where the waste heat $H_W$ is thermally transferred to the liquid 11L by the first ends 14a, and finally the waste heat $H_W$ is transferred to the core 11 where it spreads upward and outward towards the vanes 23 and the top face 13 and is dissipated by the air flow F.

Referring to Table 1 where data in a right column depicts an increase in heat removal efficiency of the cooling device 10 of the present invention in comparison to a prior cooling device. The prior cooling device did not include the heat pipes 14, the liquid chamber 15, or the cavity 11r. Both cooling devices had sixty (60) twin fins 21 connected with their respective cores 11, a height of 50 mm (excluding the fan), and a diameter of 69 mm measured at the outer edges 25 of the twin fins 21. The prior cooling device had a mass of 900 grams. In contrast, the cooling device 10 had a mass of 500 grams. The mass of both cooling devices did not include the mass of the Delta cooling fans. The cooling device 10 included two heat pipes 14 with a diameter of 8.0 mm and made by YC Tek.

In Table 1, the case temperature is a temperature measured at the component 50 (e.g. at the surface 51) after the component 50 has reached a stable temperature so that a temperature difference $\Delta T$ between the case temperature and the ambient temperature can be measured. A thermal resistance of the cooling devices is calculated by dividing the $\Delta T$ by a thermal output of the component 50 in Watts (e.g. $\Delta T \div W$). Accordingly, for the cooling device 10, the thermal resistance was ([41° C.−25° C.]÷100 W=0.16° C./W). With 100 W of power dissipation from the components 50, the cooling device 10 had a 6° C. lower case temperature resulting in a 0.06° C./W lower thermal resistance for an improvement of 27% when compared with the prior cooling device (e.g. [{(0.22−0.16)÷0.22}*100]=27.2727%). Another advantage of the cooling device 10 is that its mass is lower by 400 grams (i.e. 900 grams−500 grams) when compared to the cooling device without the heat pipes 14.

TABLE 1

| Data | A Prior Cooling Device without heat pipes 14 | A Cooling Device 10 with Heat Pipes 14 and Liquid Chamber 15 |
|---|---|---|
| Mass of Cooling Device | 900 grams | 500 grams |
| Thermal Output of Component | 100 W | 100 W |
| Fan Type | Delta EFB0712EH | Delta EFBO712EH |
| Case Temperature | 47° C. | 41° C. |
| Ambient Temperature | 25° C. | 25° C. |
| Thermal Resistance | 0.22° C./W | 0.16° C./W |
| Improvement | 0% | 27% |

Referring to FIG. 14a, the air flow F can be in a direction from the leading edges 26 to the trailing edges 24 or from the trailing edges 24 to the leading edges 26. Accordingly, an air flow source, such as a fan, can either push or pull air through the slots S and over the vanes 23. The air flow F entering the chamber 30 can also circulate over the top face 13 to dissipate the waste heat $H_W$ from the core 11. The core 11 can have a length L that is long relative to a width W of the core 11 (see FIG. 7a) so that an aspect ratio (L÷W) of the core 11 is large and the waste heat $H_W$ is thermally conducted up the core 11 towards the top face 13. As was described above, the roots 27 and grooves G can span substantially all of the length L so that the waste heat $H_W$ is transferred from the core 11 to the twin fins 21 along the entire length of the roots 27. The core 11 can be made from a high thermal conductivity material (e.g. copper or graphite) that efficiently conducts the waste heat $H_W$ upward along the axis Z and outward towards the twin fins 21 so that the waste heat $H_W$ is spread over a larger area.

Figure 15:
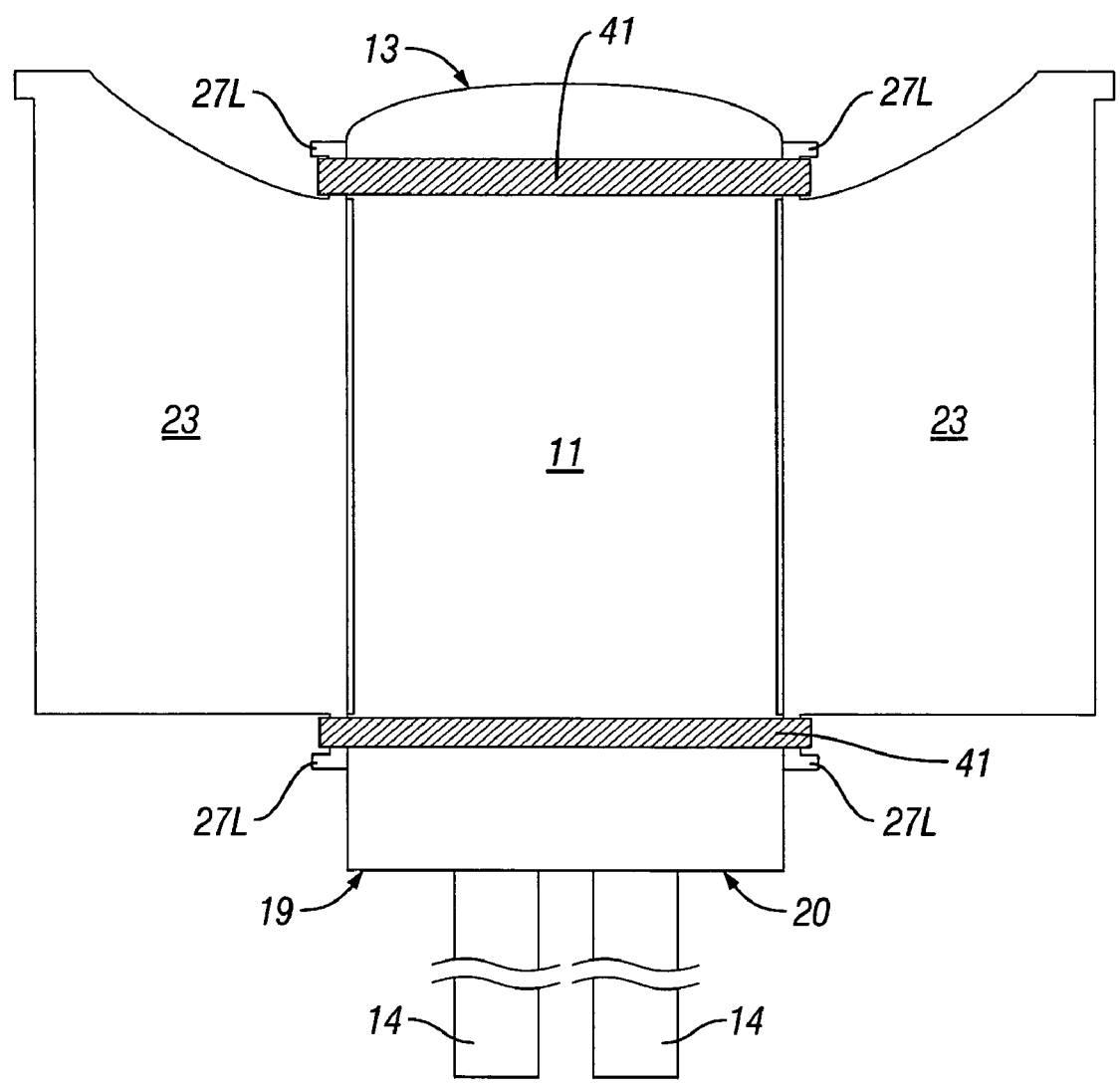
FIG. 15 is a cross-sectional view depicting twin fins connected with a core using a clamp.

In FIG. 15, the roots 27 of the twin fins 21 can be connected with the grooves G using a clamp 41 that clamps around an ear 27L on the root 27. The clamp 41 can be a C-clamp, a clamping ring, or the like and can exert a force on the roots 27 that urges the roots 27 into firm contact with the grooves G. As described above, a thermal interface material or a thermal sealant material can be applied to the roots 27 and/or the grooves G to reduce thermal resistance between the core 11 and the twin fins 21.

Figure 16:
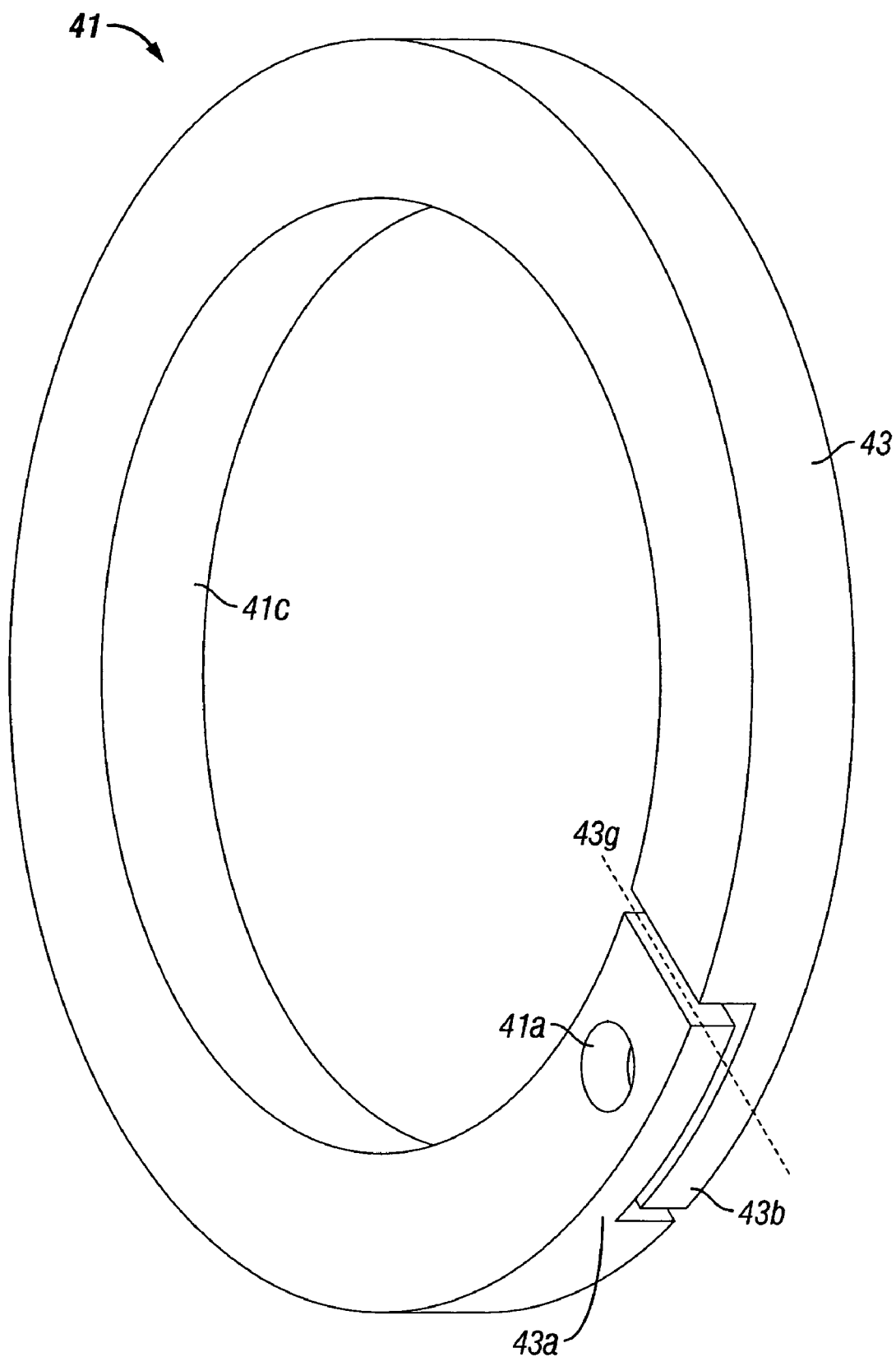
FIG. 16 is a profile view depicting an example of a clamp.

One example of an implementation of the clamp 41 is depicted in FIG. 16, where the clamp 41 includes a clamp body 43 with a gap 43g (see dashed line) in the clamp body 43. At the gap 43g, the clamp body 43 is split into two parts 43a and 43b with an aperture 41a formed in both parts (43a, 43b). The aperture 41a can receive a fastener or the like to urge the two parts (43a, 43b) together so that a clamping force is exerted on the roots 27 of the twin fins 21 by a clamping surface 41c. The clamping force urges the roots 27 into contact with the grooves G.

Figure 17:
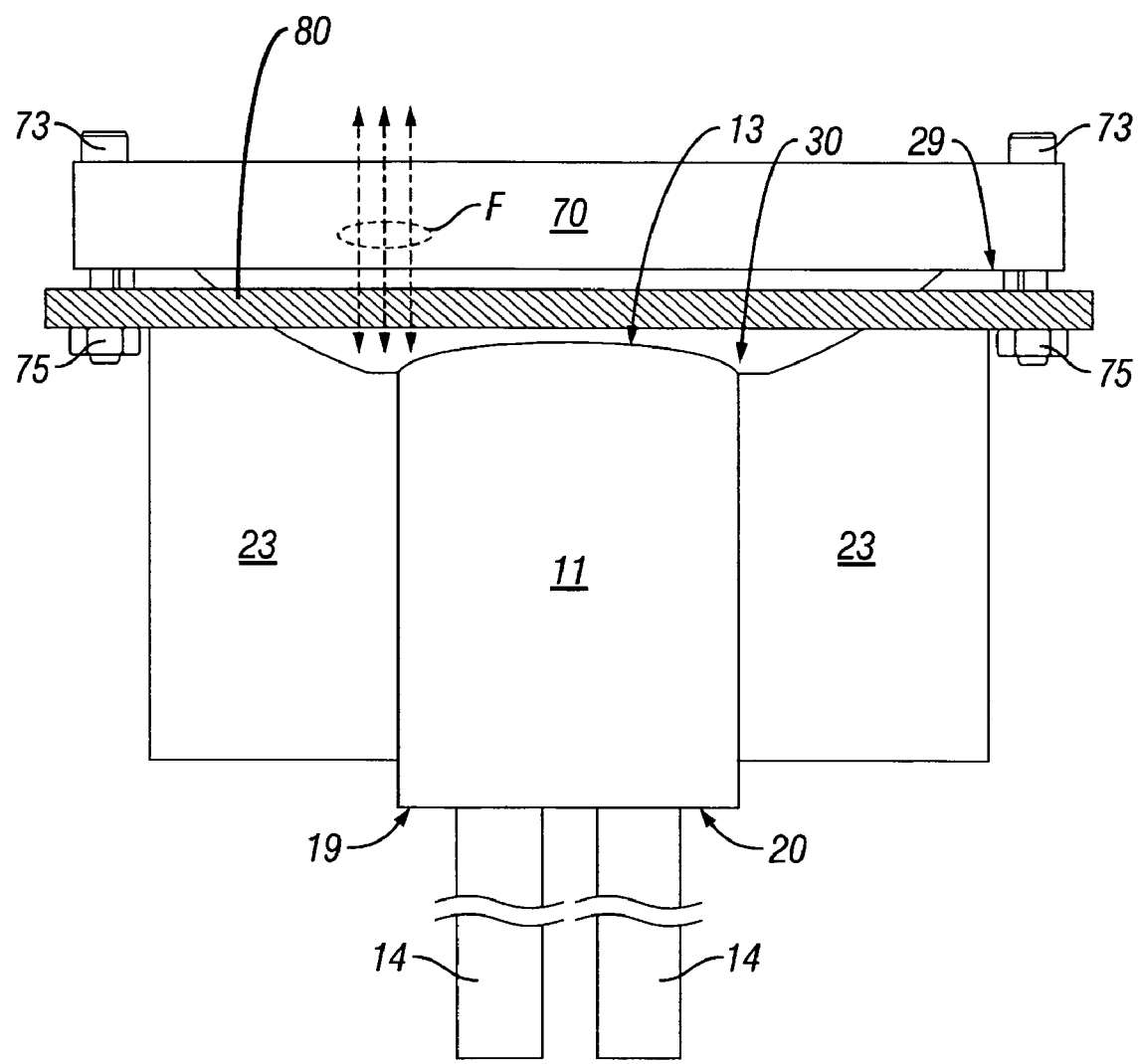
FIGS. 17 and 18 are cross-sectional views depicting an air flow source.

In FIG. 17, as one example of an air flow source 70, a fan can be mounted on the cooling device 10. The mounting can be accomplished using a mounting ring 80 that abuts with the lips 22 on the outer edges 25 of the vanes 23. Holes (not shown) formed in the fan and the mounting ring 80 can accommodate fasteners 73 and 75 (e.g. a nut and bolt) that pass through holes to connect the air flow source 70 with the mounting ring 80. The blades (not shown) of the air flow source 70 may be positioned inside the chamber 30 or outside the chamber 30. The air flow source 70 generates the air flow F and the air flow source 70 can push or pull air through the cooling device 10.

Figure 18:
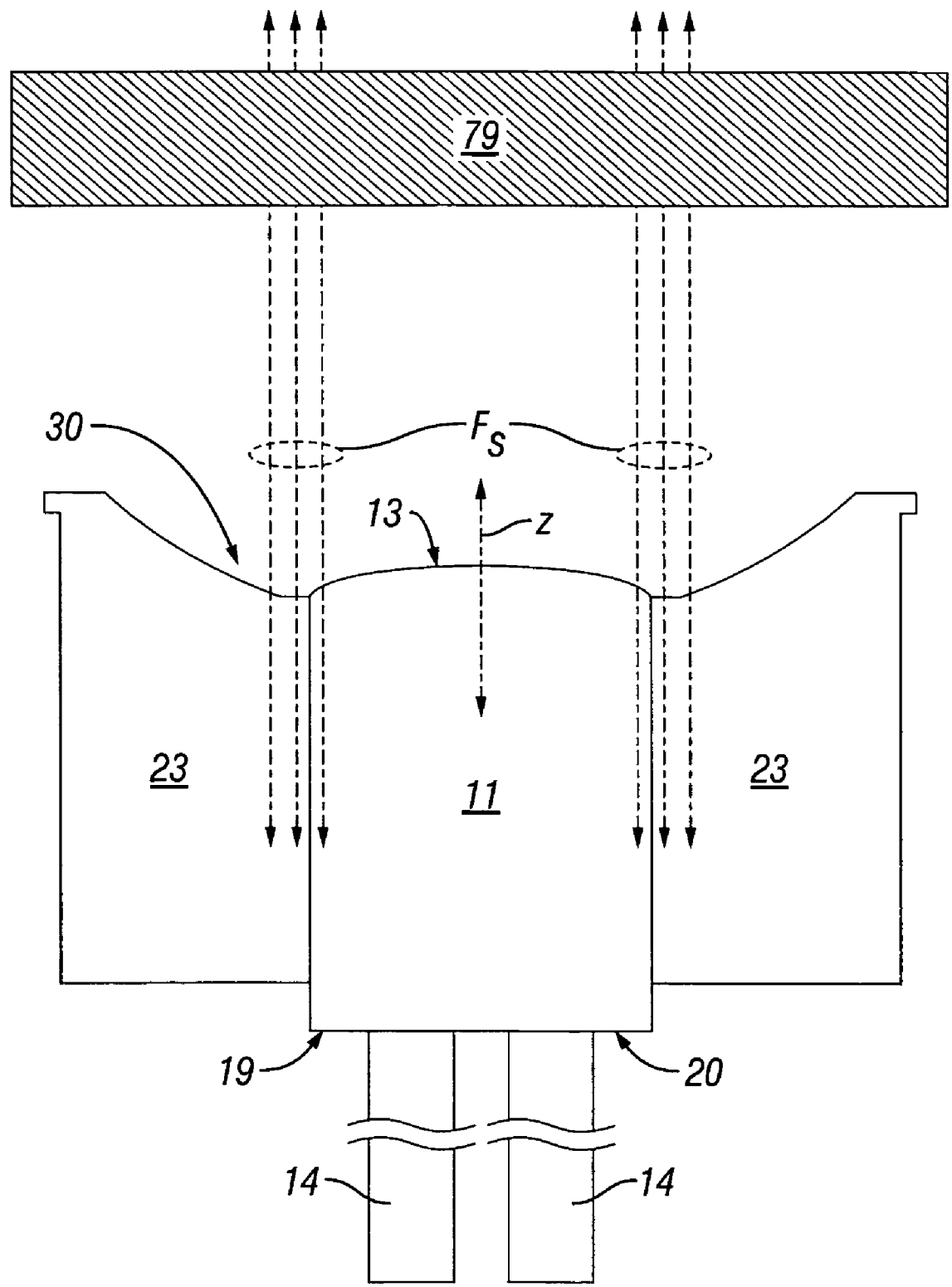

Alternatively, in FIG. 18, as another example of an air flow source 79, a system fan or the like supplies an air flow $F_S$ that flows through the slots S and over the vanes 23 to dissipate heat from the core 11. The air flow $F_S$ is a system air flow in that other components in the system including the cooling device 10 and the component 50 are cooled by the air flow $F_S$. The air flow source 79 can be an axial fan, a blower, or an air conditioning unit, for example. The air flow source 79 can supply the air flow $F_S$ through one or more conduits and a duct connected with one of the conduits can direct a portion of the airflow $F_S$ to the cooling device 10. For example, the duct can be positioned adjacent to the chamber 30 so that the air flow exiting the duct passes through the slots S and over the vanes 23.

Figure 19:
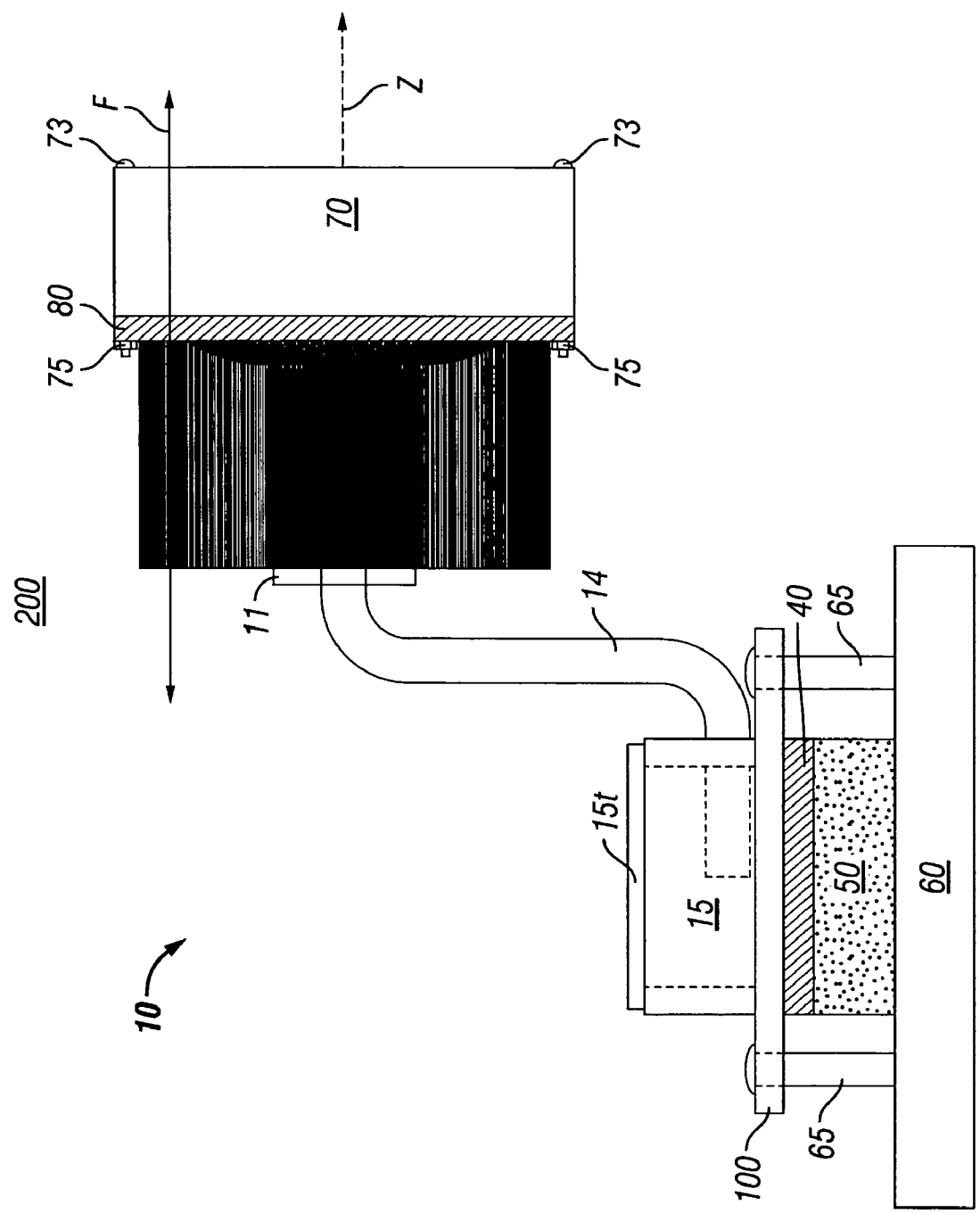
FIGS. 19 and 20 are cross-sectional views depicting a system for dissipating heat from a component.

In FIG. 19, a system 200 for dissipating waste heat $H_W$ from a component can include the cooling device 10 and the air flow source 70 as described above. The air flow source 70 can be an axial electric fan, for example. The base 100 can be used to position the mounting surface 105 in thermal communication with the component 50 to be cooled. Optionally, the thermal interface material 40 can be used to thermally communicate the waste heat $H_W$ from the component 50 to the mounting surface 105 and into the liquid chamber 15. The base 100 can be mounted on a substrate 60, such as a PC board, for example, that carries the component 50. The base 100 can be mounted with the substrate 60 using fasteners 65 inserted through the mounting holes 101 in the base 100.

Figure 20:
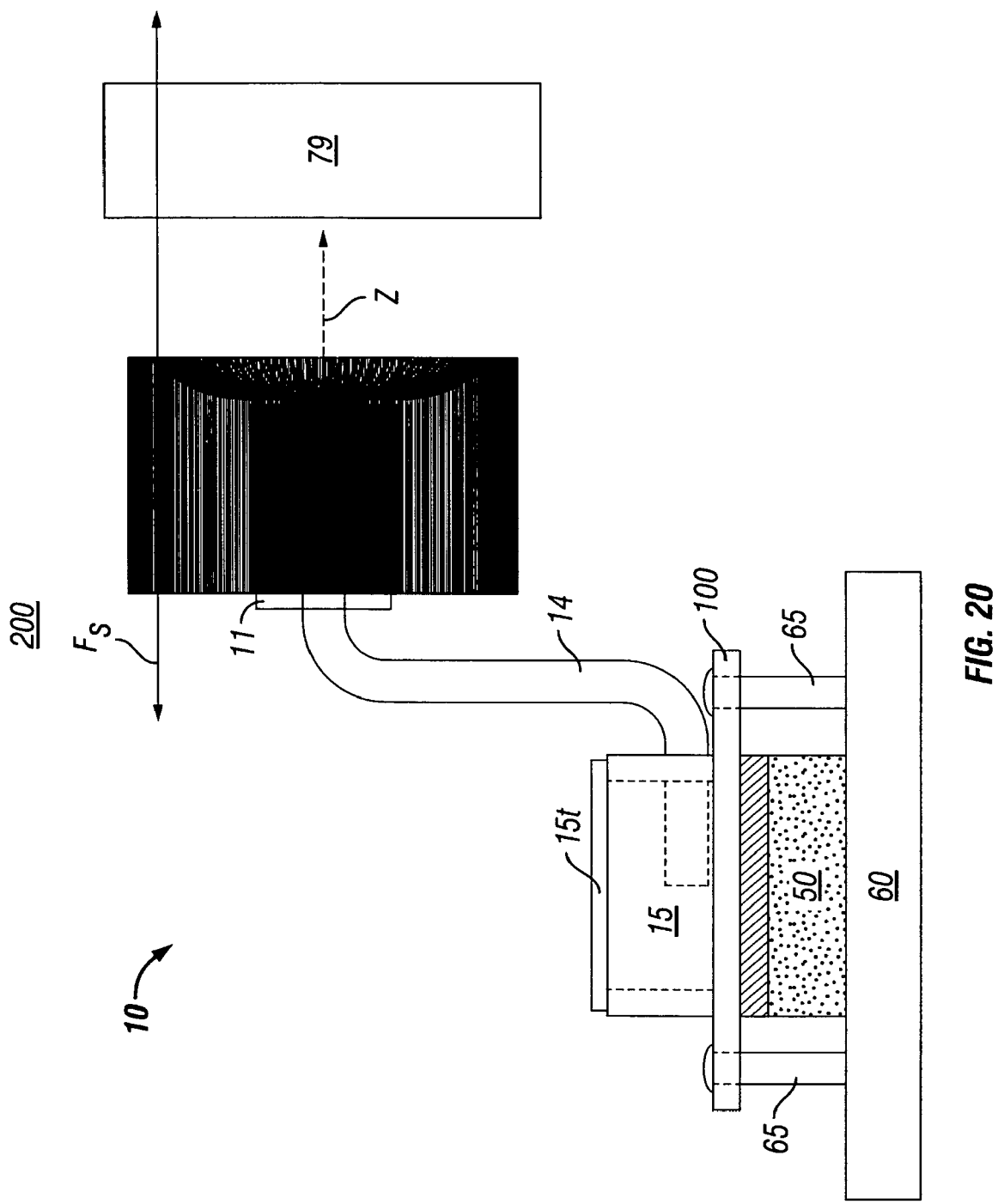

In contrast, a system 200 for dissipating waste heat $H_W$ from a component can include the cooling device 10 and the air flow source 79 as depicted in FIG. 20, where a system fan supplies the air flow $F_S$. As described above, the base 100 can be mounted to a PC board that carries the component 50. The core 11 can be positioned so that the air flow $F_S$ and the axis Z are aligned with each other. The alignment may be used to improve air flow through the slots S, over the top face 13, and over the vanes 23.

The twin fins 21 can be made from a variety of thermally conductive materials including but not limited to aluminum (Al), copper (Cu), silver (Ag), gold (Au), alloys of those materials, and a high thermal conductivity resin. Preferably, the vanes 23 and the root 27 are a homogenous unit, that is, they are a unitary whole. The twin fins 21 can be manufactured using a pressing or stamping process. A bending or rolling process can be used to form the arcuate profile 23a or to form an angular or non-planar profile on the vanes 23. As an example, the twin fins 21 can be stamped from a sheet of material, such as a copper (Cu) sheet or an aluminum (Al) sheet.

As another example, the twin fins 21 can be molded from a high thermal conductivity material such as a resin or a carbon fiber re-aligned resin. The vanes 23 need not be identical among the twin fins 21. Because the twin fins 21 are attached by their roots 27 to the core 11, twin fins 21 with vanes 23 that differ in size and shape can be connected with the core 11 via the grooves G.

The heat pipes 14 can be an off-the-shelf commercially available model or a custom made model. The heat pipes 14 can be supplied by a company such as Thermacore® or Yeh-Chiang Technology Corporation® (YC Tek), for example. Suitable materials for the heat pipe 14 include but are not limited to cooper (Cu) and aluminum (Al). The heat pipes 14 can be a solid heat pipe or hollow heat pipe including a working fluid and a wicking/capillary structure. Those skilled in the art will appreciate that other mean can be used to connect the heat pipe 14 with the apertures (15a, 20b) including but not limited to welding, brazing, soldering, and press fitting, just to name a few.

The core 11, the plate 20, the liquid chamber 15, the lid 15t, and the base 100 can also be made from a variety of thermally conductive materials including but not limited to aluminum (Al), copper (Cu), silver (Ag), gold (Au), alloys of those materials, silicon (Si) substrate, thermally conductive resins, and graphite. The core 11 and the plate 20 can be manufacture using processes including but not limited to casting, forging, extruding, and machining. The groves G or the projections 12 can be machined in the core 11 or they can be formed during the casting, forging, or extruding processes. As one example, the core 11 can be made using a forging process or an impact forging process. A shape of the core 11 as well as the grooves G can be directly forged. The cavity 11r and the aperture 19a can be machined by a process such as milling, for example. The cavity 11r can also be formed from a casting process and if necessary subsequently machined to shape. The core 11 can have any shape and need not have a circular or cylindrical shape as depicted herein. The core 11 and the twin fins 21 can be made from dissimilar materials. As an example, the core 11 can be made from graphite and the twin fins 21 can be made from copper (Cu). Alternatively, the core 11 can be copper (Cu) and the twin fins 21 can be made from aluminum (Al). The liquid chamber 15, the lid 15t, and the base 100 can be made by the processes described above for the core 11.

As another example, the base 100 can be machined from a block of metal (e.g. copper) with the liquid chamber 15 formed in the same block during the machining of the base 100. The reservoir 15r can be milled out of the liquid chamber 15 and then the apertures 15a can then be drilled into a sidewall of the liquid chamber 15 until they extend all the way to the reservoir 15r. The lid 15t can be machined from metal stock and then connected to the liquid chamber 15 by brazing or soldering. The liquid 15L can be dispensed into the reservoir 15r followed by inserting the second ends 14b of the heat pipes 14 into the apertures 15a so that the second ends are positioned in the reservoir 15r and are in contact with the liquid 15L. After the insertion, the heat pipes 14 can be soldered or brazed to the liquid chamber 15 to seal the liquid 15L in the reservoir 15r. The plate 20 and apertures 20b can be machined from metal stock and the first ends 14a of the heat pipes 14 can be inserted through the apertures 20b and then the heat pipe 14 can be soldered, brazed, or welded to the apertures 20b. The cavity 11r of the core 11 can be filled with the liquid 11L and then the plate 20 can be positioned in the aperture 19a on the bottom face 19 so that the first ends 14a are positioned in the cavity 11r and are in contact with the liquid 11L. The plate 20 can then be soldered, brazed, or welded to the core 11 thereby sealing the liquid 11L in the cavity 11r. Suitable materials for the liquids (11L, 15L) include but are not limited to water ($H_2O$), ammonia ($NH_3$), ammonia ($NH_3$) plus an ionic surfactant, acetone, methanol, a heat transfer fluid, and dilute aqueous solutions of long chain alcohols. Examples of the heat transfer fluid include but are not limited to a THERMINOL® brand heat transfer fluid.

Although several embodiments of the present invention have been disclosed and illustrated, the invention is not limited to the specific forms or arrangements of parts so described and illustrated. The invention is only limited by the claims.

What is claimed is:

1. A cooling device for dissipating heat from a component, comprising:
    a plurality of twin fins, each twin fin including a root and a pair of vanes extending outward of the root and spaced apart to define a slot between the vanes, each vane including a leading edge, a trailing edge, and an outer edge;
    a heat pipe including a first end and a second end;
    a core including a plurality of grooves adapted to receive the root, a top face, a cavity, a liquid disposed in the cavity, and a plate connected with the core and including an aperture, the heat pipe is connected with the aperture and the first end is positioned in the cavity and is in contact with the liquid; and
    a liquid chamber including a reservoir, a liquid disposed in the reservoir, an aperture, and a base including a mounting surface for thermally connecting the liquid chamber with the component, the heat pipe is connected with the aperture and the second end is positioned in the reservoir and is in contact with the liquid.

2. The cooling device as set forth in claim 1, wherein the liquid chamber further includes a lid connected with the liquid chamber and operative to seal the liquid in the reservoir.

3. The cooling device as set forth in claim 1, wherein the first end of the heat pipe is immersed in the liquid in the cavity and the second end of the heat pipe is immersed in the liquid in the reservoir.

4. The cooling device as set forth in claim 1, wherein the base further includes a plurality of mounting holes adapted to receive a fastener for positioning the mounting surface in thermal communication with the component.

5. The cooling device as set forth in claim 1, wherein the grooves extend inward of a surface of the core.

6. The cooling device as set forth in claim 1, wherein each groove comprises a pair of spaced apart projections that extend outward of a surface of the core.

7. The cooling device as set forth in claim 1, wherein the grooves are a selected one of aligned with an axis of the core or aligned at an angle with the axis of the core.

8. The cooling device as set forth in claim 1, wherein the vanes include a top portion adapted for mounting an air flow source to the cooling device.

9. The cooling device as set forth in claim 1, wherein the vanes include a profile selected from the group consisting of a planar profile, an arcuate profile, and an angular profile.

10. The cooling device as set forth in claim 9, wherein the arcuate profile of the vanes matches a curvature of a fan blade.

11. The cooling device as set forth in claim 1 and further comprising a thermal interface material positioned on the mounting surface.

12. The cooling device as set forth in claim 1, wherein the mounting surface includes a cavity inset from the mounting surface and adapted to receive a thermal interface material.

13. The cooling device as set forth in claim 12 and further comprising a thermal interface material positioned in the cavity.

14. The cooling device as set forth in claim 1, wherein the root of each twin fin is fixedly connected with the groove.

15. The cooling device as set forth in claim 14, wherein each root is fixedly connected with the grooves using a process selected from the group consisting of welding, brazing, vacuum brazing, soldering, adhesively connecting, and gluing.

16. The cooling device as set forth in claim 1, wherein the grooves include a length that substantially spans an entirety of a length of a surface of the core and the root of each twin fin includes a length that is substantially equal to the length of the grooves.

17. The cooling device as set forth in claim 1, wherein the leading edge of the vanes includes a profile selected from the group consisting of a straight profile, an arcuate profile, a slope profile, and a composite profile.

18. The cooling device as set forth in claim 1, wherein the leading edges of the vanes form a chamber surrounding the top face of the core.

19. The cooling device as set forth in claim 1, wherein the top face of the core includes a profile selected from the group consisting of a planar profile, a sloped profile, and an arcuate profile.

20. The cooling device as set forth in claim 1, wherein the outer edge of each vane includes a lip extending outward of the outer edge and adapted to receive a mounting ring for connecting an air flow source with the cooling device.

21. The cooling device as set forth in claim 1, wherein the twin fins are made from a material selected from the group consisting of aluminum, copper, silver, gold, and alloys of those materials.

22. The cooling device as set forth in claim 1, wherein the core is made from a material selected from the group consisting of aluminum, copper, silver, gold, alloys of those materials, and graphite.

23. The cooling device as set forth in claim 1, wherein the core and the twin fins are made from dissimilar materials.

24. The cooling device as set forth in claim 1, wherein a shape of the vanes varies among the plurality of twin fins.

25. The cooling device as set forth in claim 1 and further comprising a thermal interface material applied to a selected one of the root, the grooves, or the root and the grooves and operative to increase heat transfer from the core to the twin fins.

26. The cooling device as set forth in claim 1, wherein the liquid disposed in the cavity comprises a material selected from the group consisting of water, ammonia, ammonia including an ionic surfactant, acetone, methanol, a heat transfer fluid, and alcohol.

27. The cooling device as set forth in claim 1, wherein the liquid disposed in the reservoir comprises a material selected from the group consisting of water, ammonia, ammonia including an ionic surfactant, acetone, methanol, a heat transfer fluid, and alcohol.

28. A system for dissipating heat from a component, comprising:
 a cooling device including
 a plurality of twin fins, each twin fin including a root and a pair of vanes extending outward of the root and spaced apart to define a slot between the vanes, each vane including a leading edge, a trailing edge, and an outer edge;
 a heat pipe including a first end and a second end;
 a core including a plurality of grooves adapted to receive the root, a top face, a cavity, a liquid disposed in the cavity, and a plate connected with the core and including an aperture, the heat pipe is connected with the aperture, and the first end is positioned in the cavity and in contact with the liquid;
 a liquid chamber including a reservoir, a liquid disposed in the reservoir, an aperture, a base including a mounting surface for thermally connecting the liquid chamber with the component, the heat pipe is connected with the aperture, and the second end is positioned in the reservoir and in contact with the liquid; and
 an air flow source for generating an air flow over the vanes, the top face, the core, and through the slots to dissipate the heat from the component.

29. The system as set forth in claim 28, wherein the air flow source is a system fan.

30. The system as set forth in claim 28 and further comprising a thermal interface material connected with the mounting surface.

* * * * *